United States Patent
Choi et al.

(10) Patent No.: US 11,587,932 B2
(45) Date of Patent: Feb. 21, 2023

(54) METHOD FOR FABRICATING SEMICONDUCTOR DEVICE

(71) Applicant: SAMSUNG ELECTRONICS CO., LTD., Suwon-si (KR)

(72) Inventors: Byoung Deog Choi, Suwon-si (KR); Ji Woon Im, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 58 days.

(21) Appl. No.: 17/355,272

(22) Filed: Jun. 23, 2021

(65) Prior Publication Data

US 2021/0320105 A1   Oct. 14, 2021

Related U.S. Application Data

(63) Continuation of application No. 16/682,061, filed on Nov. 13, 2019, now Pat. No. 11,049,860.

(30) Foreign Application Priority Data

May 30, 2019   (KR) ........................ 10-2019-0063657

(51) Int. Cl.
| | | |
|---|---|---|
| *H01L 27/108* | (2006.01) | |
| *H01L 21/764* | (2006.01) | |
| *B82Y 10/00* | (2011.01) | |
| *H01L 49/02* | (2006.01) | |

(52) U.S. Cl.
CPC ........ *H01L 27/10805* (2013.01); *B82Y 10/00* (2013.01); *H01L 21/764* (2013.01); *H01L 27/108* (2013.01); *H01L 27/10814* (2013.01); *H01L 27/10885* (2013.01); *H01L 28/75* (2013.01)

(58) Field of Classification Search
CPC . H01L 27/10805; H01L 27/108; H01L 28/75; H01L 21/764; H01L 27/10814; H01L 27/10885; B82Y 10/00
See application file for complete search history.

(56) References Cited

U.S. PATENT DOCUMENTS

| | | |
|---|---|---|
| 6,849,948 B2 | 2/2005 | Chen et al. |
| 6,967,172 B2 | 11/2005 | Leung et al. |
| 8,198,665 B2 | 6/2012 | Kawabata et al. |
| 8,531,033 B2 | 9/2013 | Koike et al. |
| 8,999,837 B2 | 4/2015 | Park et al. |
| 9,245,849 B2 | 1/2016 | Park et al. |
| 9,275,864 B2 | 3/2016 | Perera et al. |
| 9,589,898 B2 | 3/2017 | Chun |
| 2007/0037347 A1 | 2/2007 | Kim |
| 2015/0035050 A1 | 2/2015 | Yeom et al. |
| 2015/0126013 A1 | 5/2015 | Hwang et al. |
| 2018/0174971 A1 | 6/2018 | Song et al. |
| 2018/0294369 A1 | 10/2018 | Muramoto et al. |

FOREIGN PATENT DOCUMENTS

| | | |
|---|---|---|
| KR | 10-0660022 B1 | 12/2006 |
| KR | 10-1159692 B1 | 6/2012 |
| KR | 10-1182155 B1 | 9/2012 |

*Primary Examiner* — David Vu
*Assistant Examiner* — Brandon C Fox
(74) *Attorney, Agent, or Firm* — Lee IP Law, P.C.

(57) ABSTRACT

A semiconductor device and a method of fabricating a semiconductor device, the device including a substrate; a first conductive pattern on the substrate; a second conductive pattern on the substrate and spaced apart from the first conductive pattern; an air spacer between the first conductive pattern and the second conductive pattern; and a quantum dot pattern covering an upper part of the air spacer.

20 Claims, 23 Drawing Sheets

METHOD FOR FABRICATING SEMICONDUCTOR DEVICE

CROSS-REFERENCE TO RELATED APPLICATIONS

This is a continuation application based on pending application Ser. No. 16/682,061, filed Nov. 13, 2019, the entire contents of which is hereby incorporated by reference.

Korean Patent Application No. 10-2019-0063657, filed on May 30, 2019, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

As high integration of the semiconductor devices gradually progresses, individual circuit patterns may be further miniaturized to implement more semiconductor devices in the same area.

SUMMARY

The embodiments may be realized by providing a semiconductor device including a substrate; a first conductive pattern on the substrate; a second conductive pattern on the substrate and spaced apart from the first conductive pattern; an air spacer between the first conductive pattern and the second conductive pattern; and a quantum dot pattern covering an upper part of the air spacer.

The embodiments may be realized by providing a semiconductor device including a substrate including an active region; a bit line structure on the substrate and crossing the active region; an air spacer extending along a side wall of the bit line structure; and a quantum dot pattern covering an upper part of the air spacer.

The embodiments may be realized by providing a semiconductor device including a substrate; a first conductive pattern on the substrate; an air spacer extending along a side wall of the first conductive pattern; a capping pattern on the first conductive pattern, the capping pattern including a trench open to an upper part of the air spacer; and a quantum dot pattern filling at least a part of the trench.

The embodiments may be realized by providing a semiconductor device including a substrate including an active region; a bit line structure that crosses the active region; an air spacer extending along a side wall of the bit line structure; a plurality of landing pads on the bit line structure and connected to the active region; a trench open to an upper part of the air spacer and separating each of the landing pads; and a quantum dot pattern filling at least a part of the trench.

The embodiments may be realized by providing a method of fabricating a semiconductor device, the method including forming a first conductive pattern on a substrate and a second conductive pattern on the substrate such that the first conductive pattern is spaced apart from the second conductive pattern; forming an air spacer between the first conductive pattern and the second conductive pattern; and forming a quantum dot pattern such that the quantum dot pattern covers an upper part of the air spacer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
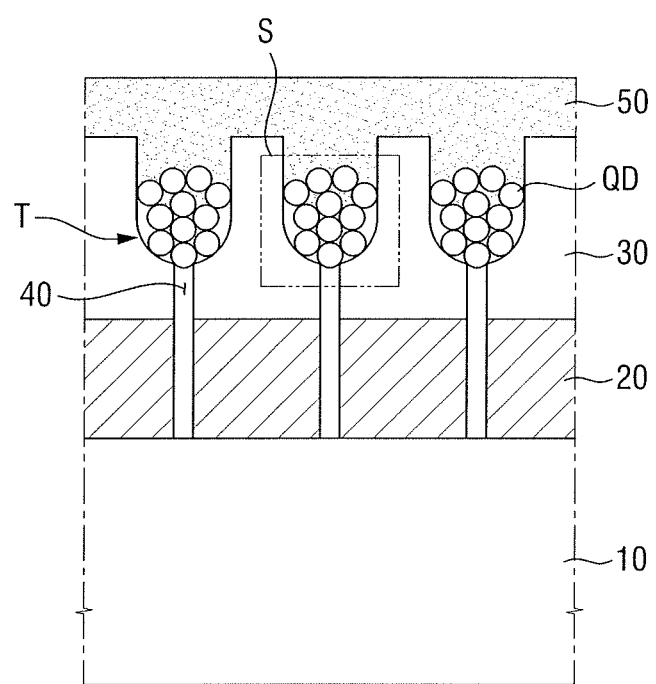
FIG. 1 illustrates a cross-sectional view of a semiconductor device according to some embodiments.
Figure 1:
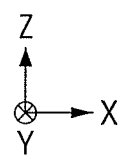
Figure 2:
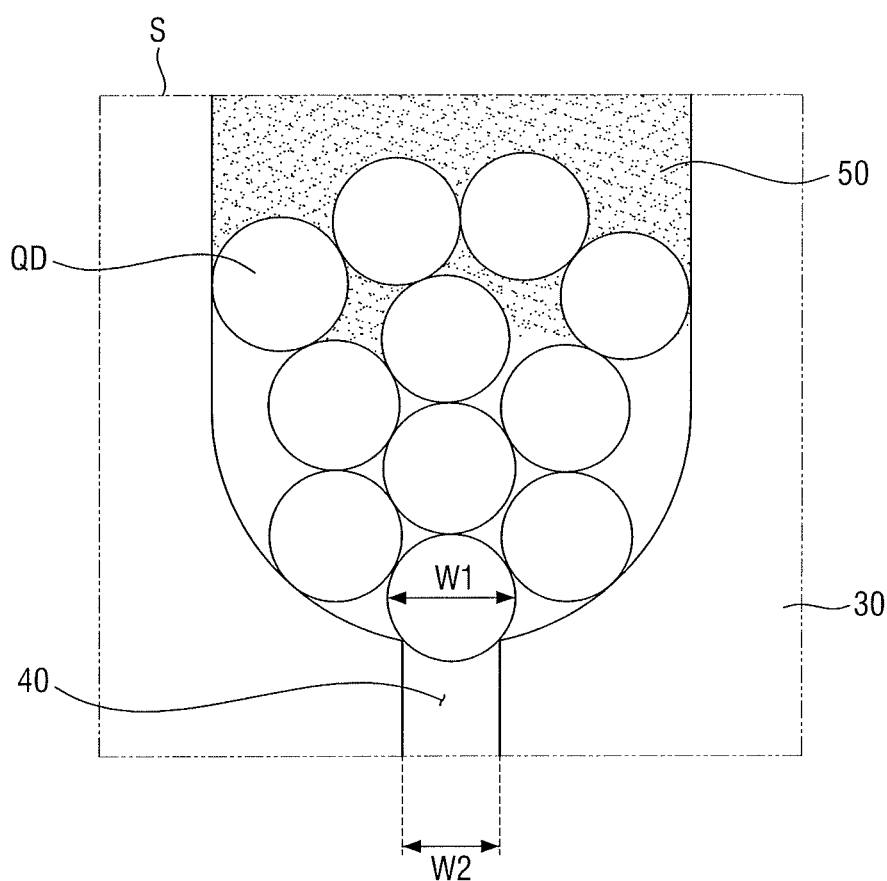
FIG. 2 illustrates an enlarged view of a region S of FIG. 1.

FIG. 1 illustrates a cross-sectional view of a semiconductor device according to some embodiments. FIG. 2 illustrates an enlarged view of a region S of FIG. 1.

Referring to FIGS. 1 and 2, the semiconductor device according to some embodiments may include a substrate 10, a plurality of conductive patterns 20, an air spacer 40, a quantum dot pattern QD, and a filling insulation film 50.

In an implementation, the substrate 10 may have a structure including, e.g., a base substrate and an epitaxial layer stack. The substrate 10 may also be a silicon substrate, a gallium arsenide substrate, a silicon germanium substrate or an SOI (Semiconductor On Insulator) substrate. As an example, the substrate 10 described below is a silicon substrate.

A plurality of conductive patterns 20 may be on the substrate 10. In an implementation, the plurality of conductive patterns 20 may be in contact (e.g., direct contact) with the substrate 10. In an implementation, the plurality of conductive patterns 20 may be in or on an insulation film on the substrate 10, and may not be in direct contact with the substrate 10.

The air spacer 40 may be between two adjacent conductive patterns 20. For example, the plurality of conductive patterns 20 may be electrically spaced apart from one another (e.g., in a first direction X) by the air spacer 40. In an implementation, the air spacer 40 may be made up of air or a void.

In an implementation, the air spacer 40 may simply expose the side surfaces of the respective conductive patterns 20. In an implementation, the insulation film (or a spacer) may be between the air spacer 40 and the respective conductive patterns 20.

The quantum dot pattern QD may be on the air spacer 40. The quantum dot pattern QD may cover an upper part of the air spacer 40 (e.g., an end or side of the air spacer 40 that is distal to the substrate 10 in a third direction Z). For example, the quantum dot pattern QD may define an upper end of the air spacer 40. For example, the quantum dot pattern QD may close off or block an open upper end of the air spacer 40.

In an implementation, a capping pattern 30 may be on the conductive pattern 20. In an implementation, the capping pattern 30 may include a trench T that exposes the upper end of the air spacer 40 (e.g., the trench T may be open to or in fluid communication with the air spacer). The quantum dot pattern QD may fill at least a part of the trench T. For example, as shown in FIGS. 1 and 2, the quantum dot pattern QD may fill a lower part of the trench T (e.g., a part of the trench T that is proximate to the substrate 10 in the third direction Z). This may facilitate covering of the upper end of the air spacer 40 exposed to the trench T by the quantum dot pattern QD.

The quantum dot pattern QD may include a plurality of quantum dots. The quantum dots may refer to ultrafine semiconductor particles having a size of several nanometers. In an implementation, the quantum dot pattern QD may include, e.g., silicon oxide quantum dots, silicon nitride quantum dots, polysilicon quantum dots, silicon germanium quantum dots, or combinations thereof. As used herein, the term "or" is not an exclusive term, e.g., "A or B" would include A, B, or A and B.

In an implementation, the quantum dot pattern QD may include, e.g., spherical quantum dots. In an implementation, the quantum dot pattern QD may include, e.g., a plurality of quantum dots having the same size as each other. In an implementation, the quantum dot pattern QD may include, e.g., other forms of quantum dots rather than a spherical form and/or may include a plurality of quantum dots of sizes different from each other.

In an implementation, a size of the quantum dot pattern QD may be greater than a width of the air spacer 40. In an implementation, as shown in FIG. 2, when the quantum dot pattern QD is spherical, a diameter W1 of the quantum dot pattern QD as measured in the first direction X may be greater than a width W2 of the air spacer 40 as measured in the first direction X.

The filling insulation film 50 may be on the quantum dot pattern QD. The filling insulation film 50 may cover the quantum dot pattern QD. In an implementation, as illustrated in FIG. 2, the filling insulation film 50 may partially fill spaces (e.g., filling only some spaces) between the plurality of quantum dots of the quantum dot pattern QD. In an implementation, the filling insulation film 50 may fill all the spaces between the plurality of quantum dots of quantum dot pattern QD or may not fill the spaces between the plurality of quantum dots.

In an implementation, the filling insulation film 50 may include, e.g., silicon nitride (SiN), silicon oxynitride (SiON), silicon oxide (SiO$_2$), silicon oxycarbide (SiOC), silicon carbonitride (SiCN), silicon oxycarbonitride (SiOCN), or combinations thereof.

In an implementation, in an effort to help minimize parasitic capacitance, the air spacer 40 may be included between the conductive patterns 20. In the process of capping the upper end of the air spacer 40, if the quantum dot pattern QD were omitted, the insulation film 50 could penetrate into the air spacer 40, and the width of the air spacer 40 could become narrow. This could cause degradation of the operating characteristics of the semiconductor device including the air spacer 40.

The semiconductor device according to some embodiments may help minimize or completely prevent penetration of the filling insulation film 50 (or any other undesired element or material) into the air spacer 40 by including the quantum dot pattern QD that covers or otherwise closes off the upper end of the air spacer 40. For example, it is possible to provide a semiconductor device in which a parasitic capacitance between the conductive pattern 20 is minimized and the operating characteristics are improved. For example, undesirable narrowing of the air spacer 40 may be reduced and/or prevented by including the quantum dot pattern QD that blocks or closes off the open upper end of the air spacer 40.

Figure 3:
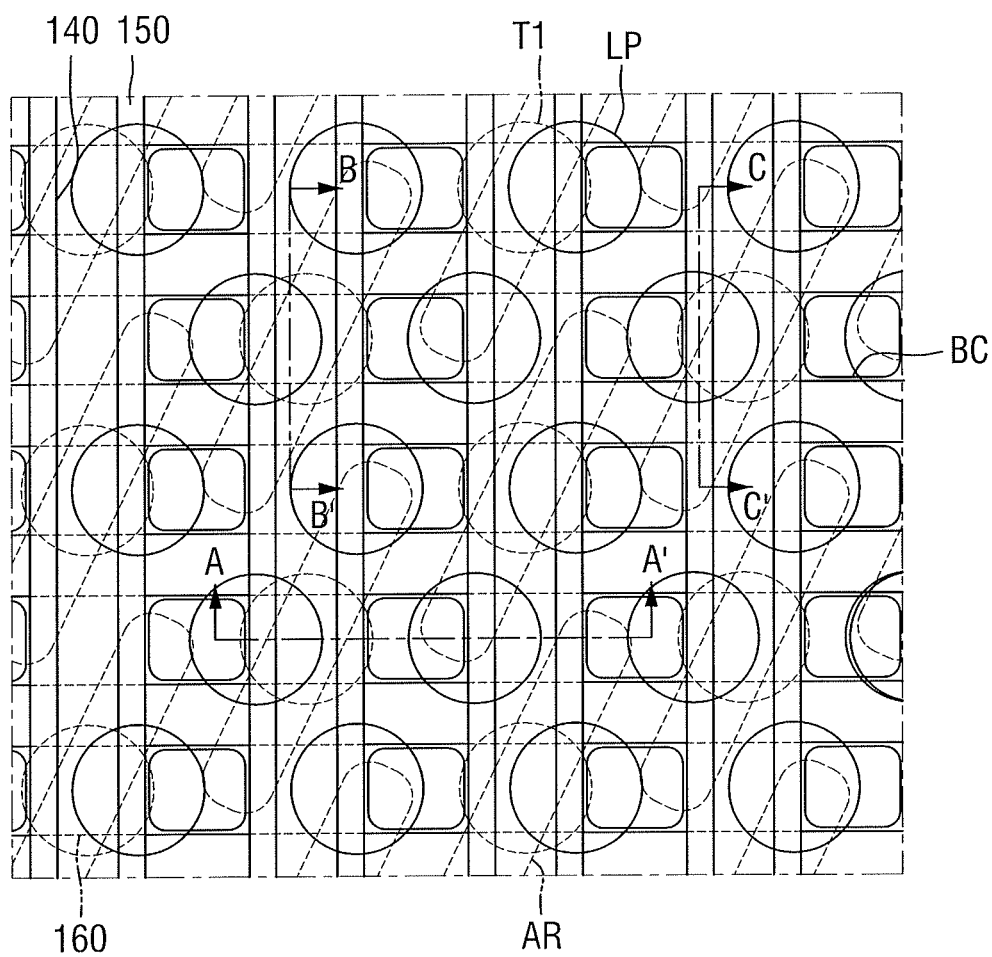
FIG. 3 illustrates a layout diagram of a semiconductor device according to some embodiments.
Figure 3:
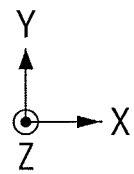
Figure 4:
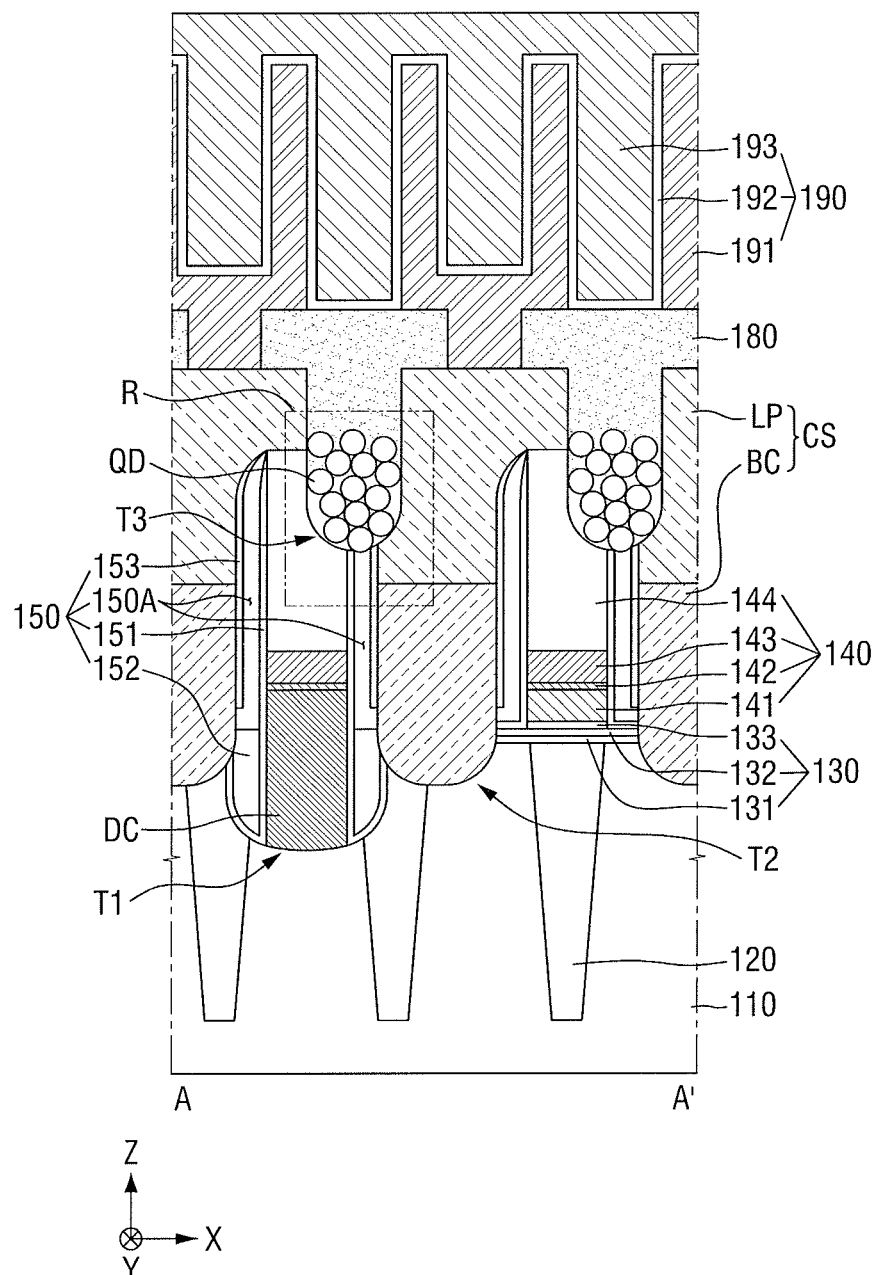
FIG. 4 illustrates a cross-sectional view taken along the line A-A' of FIG. 3.
Figure 5:
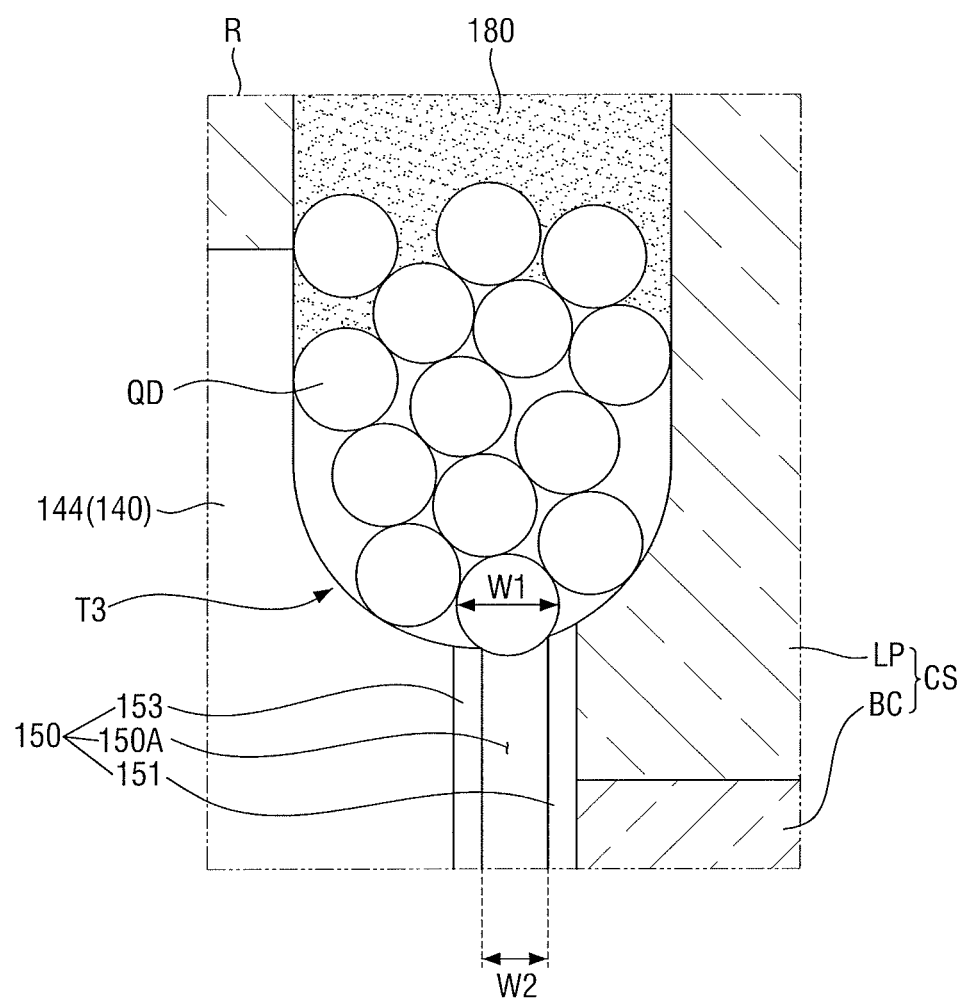
FIGS. 5 to 8 illustrate various enlarged views of a region R of FIG. 3.
Figure 9:
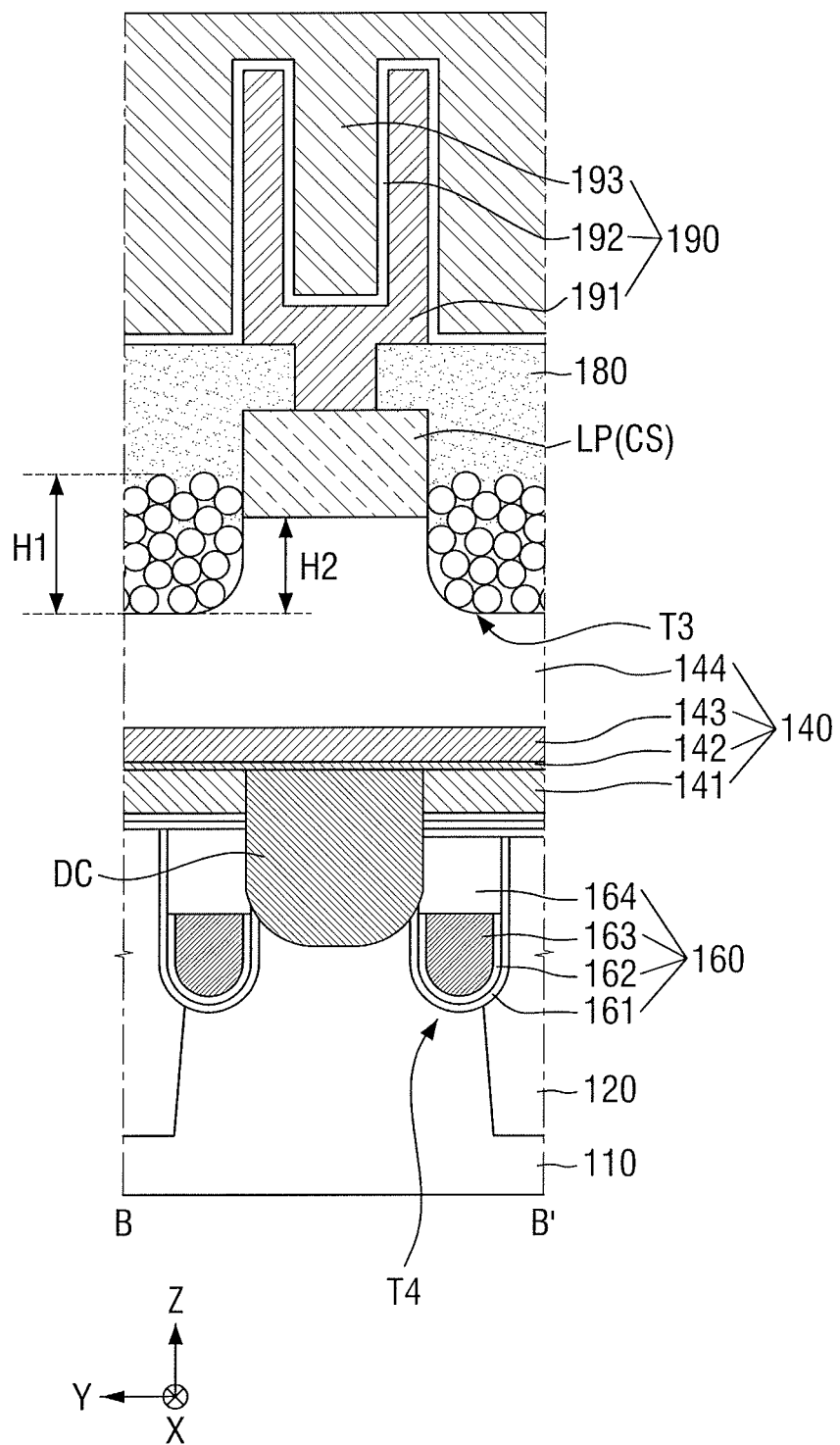
FIG. 9 illustrates a cross-sectional view taken along the line B-B' of FIG. 3.
Figure 10:
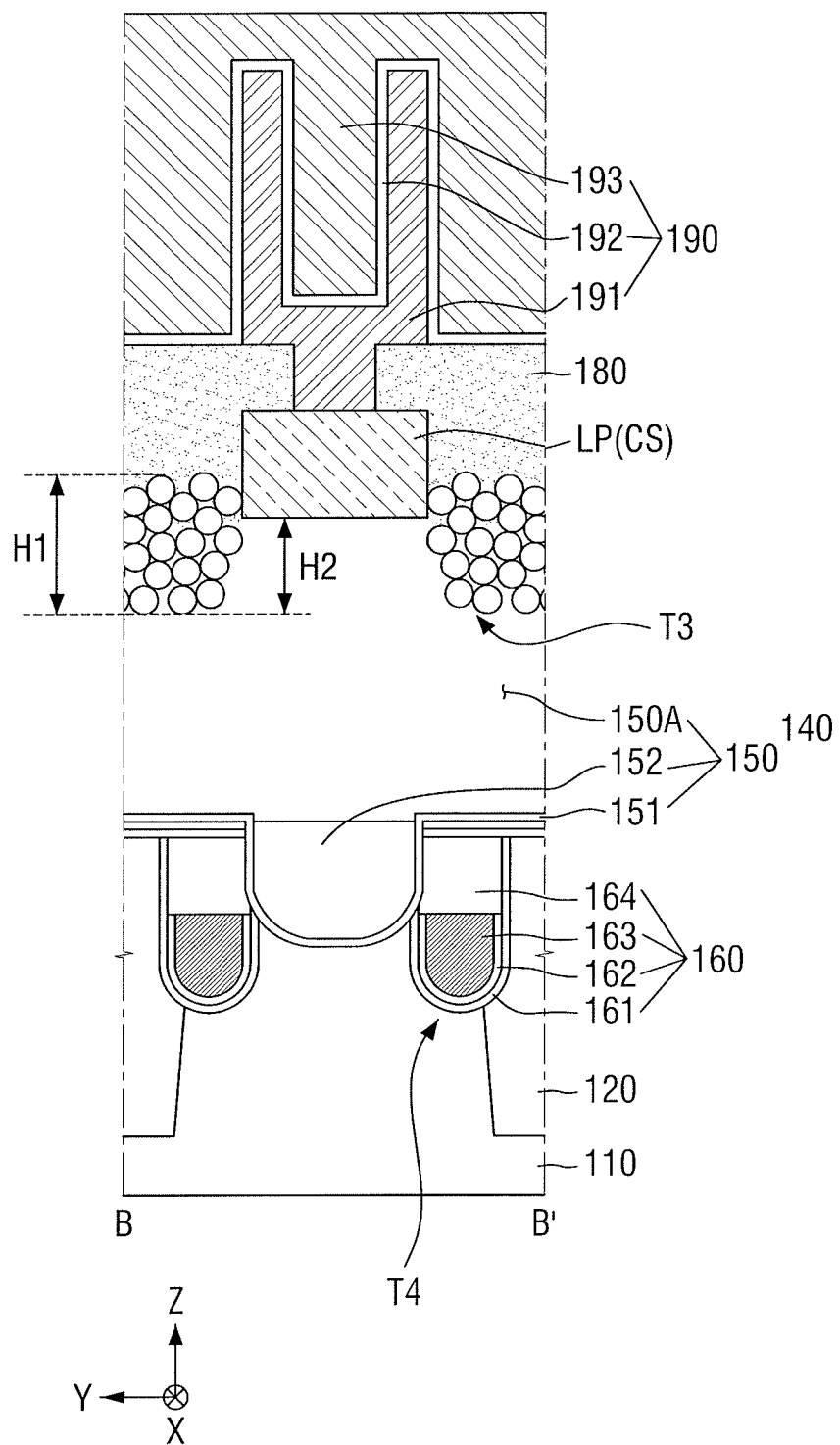
FIG. 10 illustrates a cross-sectional view taken along the line C-C' of FIG. 3.

FIG. 3 illustrates a layout diagram of a semiconductor device according to some embodiments. FIG. 4 illustrates a cross-sectional view taken along the line A-A' of FIG. 3. FIGS. 5 to 8 illustrate various enlarged views of a region R of FIG. 3. FIG. 9 illustrates a cross-sectional view taken along the line B-B' of FIG. 3. FIG. 10 illustrates a cross-sectional view taken along the line C-C' of FIG. 3. For the convenience of description, repeated parts of those described using FIGS. 1 and 2 may be briefly described or omitted.

Referring to FIGS. 3 to 9, the semiconductor device according to some embodiments may include a substrate 110, an element separation film 120, an insulation pattern 130, a bit line structure 140, a direct contact DC, a spacer structure 150, a quantum dot pattern QD, a filling insulation film 180, a contact structure CS, a word line structure 160 and a capacitor 190.

The substrate 110 may correspond to the substrate 10 of FIG. 1. The substrate 110 may include an active region AR. As design rules of semiconductor devices decrease, the active region AR may be formed in the form of hatched bars. For example, as shown in FIG. 3, the active region AR may be formed in the form of a bar extending in any direction other than the first direction X and a second direction Y, in a plane in which the first direction X and the second direction Y extend.

The active region AR may be in the form of a plurality of bars extending in directions parallel to each other. In an implementation, the center of one active region AR of the plurality of active regions AR may be adjacent to a distal end portion of another active region AR.

The active region AR may include impurities and may function as a source and drain region. In an implementation, the center of the active region AR may be connected to a bit line BL by the direct contact DC, and both ends of the active region AR may be connected to the capacitor 190 by the contact structure CS.

The element separation film 120 may define a plurality of active regions AR. In an implementation, as illustrated in FIGS. 4, 9 and 10, the side walls of the element separation film 120 may have a slope, but this is only a process feature, and the side wall may not have a slope.

In an implementation, the element separation film 120 may include, e.g., an oxide film, a nitride film, or a combination thereof. The element separation film 120 may be a single film made of one type of insulating material or may be multi-films made of combinations of various types of insulating materials.

The insulation pattern 130 may be on the substrate 110 and the element separation film 120. The insulation pattern 130 may extend along the upper surface of the substrate 110 and the upper surface of the element separation film 120 in a region in which the direct contact DC and a buried contact BC are not formed.

In an implementation, the insulation pattern 130 may be a single film, or may be multi-films including a first insulation films 131, a second insulation film 132 and a third insulation film 133 as shown. The first insulation film 131 may include, e.g., silicon oxide. The second insulation film 132 may include a material having etching selectivity with respect to the first insulation film 131. For example, the second insulation film 132 may include silicon nitride. The third insulation film 133 may include a material having a dielectric constant smaller than that of the second insulation film 132. For example, the third insulation film 133 may include silicon oxide.

In an implementation, the width of the third insulation film 133 may be substantially the same as the width of the bit line structure 140 (e.g., along the first direction X). In the present specification, the term "same" means not only completely the same thing but also fine differences that may occur due to process margins and the like.

The bit line structure 140 may be on the substrate 110, the element separation film 120, and the insulation pattern 130. The bit line structure 140 may extend lengthwise along the second direction Y across the active region AR and the word line structure 160. For example, the bit line structure 140 may diagonally cross the active region AR and vertically cross the word line structure 160. A plurality of bit line structures 140 may extend parallel to one another. In an implementation, the plurality of bit line structures 140 may be spaced apart from one another at equal intervals.

The bit line structure 140 may include first conductive patterns 141, 142 and 143 and a first capping pattern 144 sequentially stacked on the substrate 110.

The first conductive patterns 141, 142 and 143 may correspond to some of the plurality of conductive patterns 20 of FIG. 1. For example, the first conductive patterns 141, 142 and 143 may be spaced apart from other conductive patterns (e.g., the second conductive patterns BC and LP) by the air spacer 150A.

In an implementation, the first conductive patterns 141, 142 and 143 may be a single film, or it may be multi-films including the first conductive film 141, the second conductive film 142, and the third conductive film 143 as shown. The first conductive film 141, the second conductive film 142, and the third conductive film 143 may include, e.g., polysilicon, TiN, TiSiN, tungsten, tungsten silicide or a combination thereof. In an implementation, the first conductive film 141 may include, e.g., polysilicon, the second conductive film 142 may include, e.g., TiSiN, and the third conductive film 143 may include, e.g., tungsten.

The first capping pattern 144 may be on the first conductive patterns 141, 142 and 143. In an implementation, the first capping pattern 144 may include, e.g., silicon nitride.

The direct contact DC may penetrate the insulation pattern 130 to connect the active region AR of the substrate 110 and the bit line structure 140. For example, the substrate 110 may include a first trench T1 in the active region AR. The first trench T1 may penetrate the insulation pattern 130 to expose a part of the active region AR. The direct contact DC may be in the first trench T1 to connect the active region AR of the substrate 110 and the first conductive patterns 141, 142 and 143.

In an implementation, as illustrated in FIG. 3, the first trench T1 may expose the center of the active region AR. For example, the direct contact DC may be connected to the center of the active region AR. A part of the first trench T1 may overlap a part of the element separation film 120. For example, the first trench T1 may expose not only a part of the substrate 110 but also a part of the element separation film 120.

The direct contact DC may include a conductive material. For example, the first conductive patterns 141, 142, and 143 of the bit line structure 140 may be electrically connected to the active region AR of the substrate 110. The active region AR of the substrate 110 connected to the direct contact DC may function as a source and drain region.

In an implementation, the direct contact DC may include the same material as that of the first conductive film 141. In an implementation, the direct contact DC may include polysilicon. In an implementation, the direct contact DC may include a material different from the first conductive film 141 depending on the fabricating process.

The spacer structure 150 may extend along the side walls of the bit line structure 140. For example, the spacer structure 150 may extend lengthwise along the second direction Y.

In an implementation, a part of the spacer structure 150 may be in the first trench T1. For example, as shown in FIG. 4, the lower part of the spacer structure 150 may extend along the side walls of the direct contact DC. The lower part of the direct contact DC may fill a part of the first trench T1, and the lower part of the spacer structure 150 may fill another part of the first trench T1. The spacer structure 150 may be on the insulation pattern 130 in the region of the bit line structure 140 in which the direct contact DC is not formed.

The spacer structure 150 may include the air spacer 150A. The air spacer 150A may correspond to the air spacer 40 of FIG. 1. For example, the air spacer 150A may be between two adjacent conductive patterns (e.g., the first conductive patterns 141, 142 and 143 and the second conductive patterns BC and LP). The air spacer 150A may have a dielectric constant smaller than that of silicon oxide, and it is possible to more effectively reduce the parasitic capacitance of the semiconductor device according to some embodiments.

In an implementation, the spacer structure 150 may be multi-films made up of a combination of various types of insulating materials. In an implementation, the spacer structure 150 may include a first spacer 151, a second spacer 152, and a third spacer 153.

The first spacer 151 may extend along the side walls of the bit line structure 140.

In an implementation, the first spacer 151 may be between the air spacer 150A and the bit line structure 140. For example, the first spacer 151 may define one side surface of the air spacer 150A. In an implementation, as illustrated in FIG. 4, the first spacer 151 may completely cover the side walls of the bit line structure 140. In an implementation, the first spacer 151 may cover only a part of the side walls of the bit line structure 140.

In an implementation, a part of the first spacer 151 may be in the first trench T1. For example, the lower part of the first spacer 151 may extend along the side walls of the direct contact DC and the profile of the first trench T1.

The second spacer 152 may be on the first spacer 151. In an implementation, the second spacer 152 may be below the air spacer 150A (e.g., may be between the air spacer 150A and the substrate 110 in the third direction Z). For example, the second spacer 152 may define a bottom surface of the air spacer 150A.

In an implementation, the second spacer 152 may fill the first trench T1. For example, the second spacer 152 may fill a region of the first trench T1 that remains after filling of the direct contact DC and the first spacer 151.

The third spacer 153 may extend along the side walls of the bit line structure 140. The third spacer 153 may be spaced apart from the first spacer 151 by the air spacer 150A. For example, the third spacer 153 may define the other side surface of the air spacer 150A.

In an implementation, the third spacer 153 may extend along the side walls of the contact structure CS. For example, the third spacer 153 may be between the air spacer 150A and the contact structure CS.

The first to third spacers 151, 152 and 153 may include an insulating material. In an implementation, the first to third spacers 151, 152 and 153 may each independently include, e.g., silicon nitride (SiN), silicon oxynitride (SiON), silicon oxide (SiO$_2$), silicon oxycarbide (SiOC), silicon carbonitride (SiCN), silicon oxycarbonitride (SiOCN), or combinations thereof. The first to third spacers 151, 152 and 153 may include the same material as each other or may include different materials from each other.

In an implementation, the first to third spacers 151, 152 and 153 may include a material resistant to a wet etching process. For example, the first to third spacers 151, 152 and 153 may include a material that is resistant to a wet etching process using hydrogen fluoride (HF) or phosphoric acid (H$_3$PO$_4$). For convenience of description, the first to third spacers 151, 152 and 153 will be described as including silicon nitride below.

In an implementation, at least one of the first to third spacers 151, 152 and 153 may be omitted. For example, the spacer structure 150 may include only the air spacer 150A.

The quantum dot pattern QD may be on the air spacer 150A. The quantum dot pattern QD may correspond to the quantum dot pattern QD of FIG. 1. For example, the quantum dot pattern QD may cover the upper end of the air spacer 150A. For example, the quantum dot pattern QD may define an upper surface or side of the air spacer 150A.

In an implementation, the size of the quantum dot pattern QD (e.g., the size of quantum dots of the quantum dot pattern QD) may be greater than the width of the air spacer 150A. For example, as shown in FIG. 3, when the quantum dots are spherical, the diameter W1 of the quantum dots may be greater than the width W2 of the air spacer 150A.

In an implementation, the width W2 of the air spacer 150A may be, e.g., smaller than about 5 nm. In such a case, the size of the quantum dots may be 5 nm or more.

The filling insulation film 180 may be on the quantum dot pattern QD. The filling insulation film 180 may correspond to the filling insulation film 50 of FIG. 1. For example, the filling insulation film 180 may cover the quantum dot pattern QD.

In an implementation, the filling insulation film 180 may be formed by, e.g., a low pressure chemical vapor deposition (LPCVD).

Figure 6:
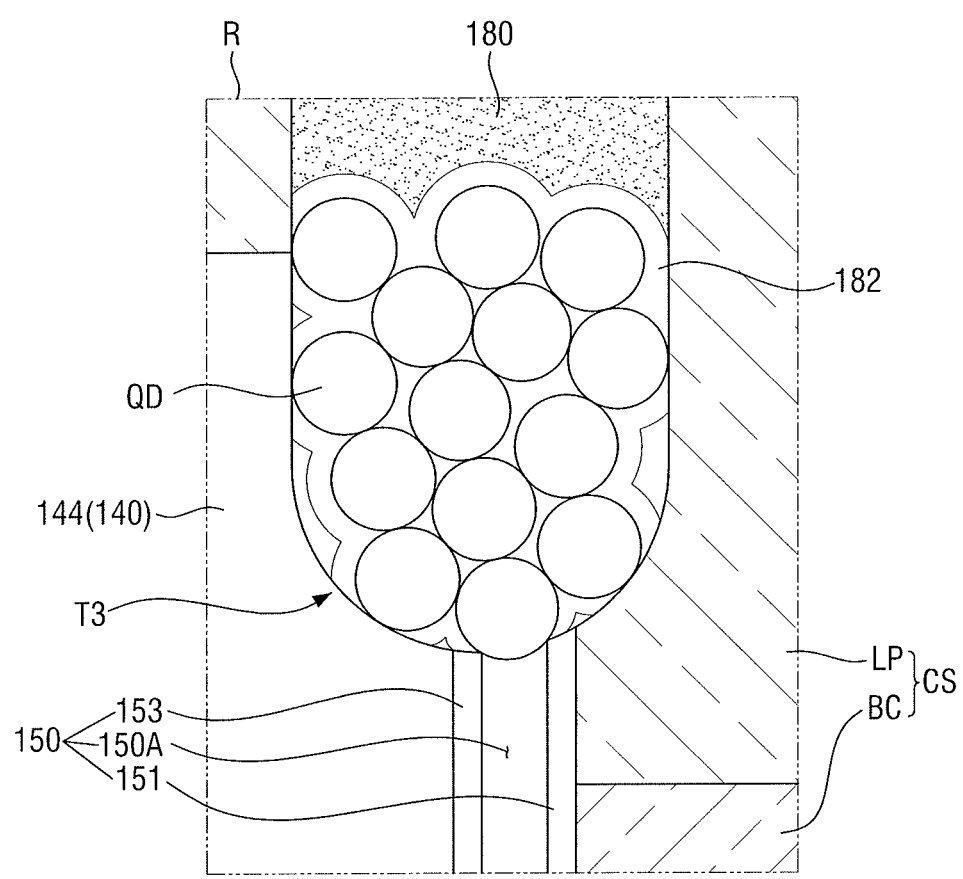

Referring to FIG. 6, the semiconductor device according to some embodiments may further include a capping insulation film 182.

The capping insulation film 182 may be between the quantum dot pattern QD and the filling insulation film 180. In an implementation, the capping insulation film 182 may extend along or cover an outer peripheral surface of the quantum dot pattern QD (e.g., on surfaces of outermost quantum dots of the quantum dot pattern QD).

In an implementation, the capping insulation film 182 may include, e.g., silicon nitride (SiN), silicon oxynitride (SiON), silicon oxide (SiO$_2$), silicon oxycarbide (SiOC), silicon carbonitride (SiCN), silicon oxycarbonitride (SiOCN), or combinations thereof.

In an implementation, step coverage of the capping insulation film 182 may be superior to or greater than step coverage of the filling insulation film 180. In an implementation, the capping insulation film 182 may include silicon carbonitride (SiCN), and the filling insulation film 180 may include silicon nitride (SiN).

In an implementation, the capping insulation film 182 may be formed by, e.g., a plasma enhanced chemical vapor deposition (PECVD).

Figure 7:
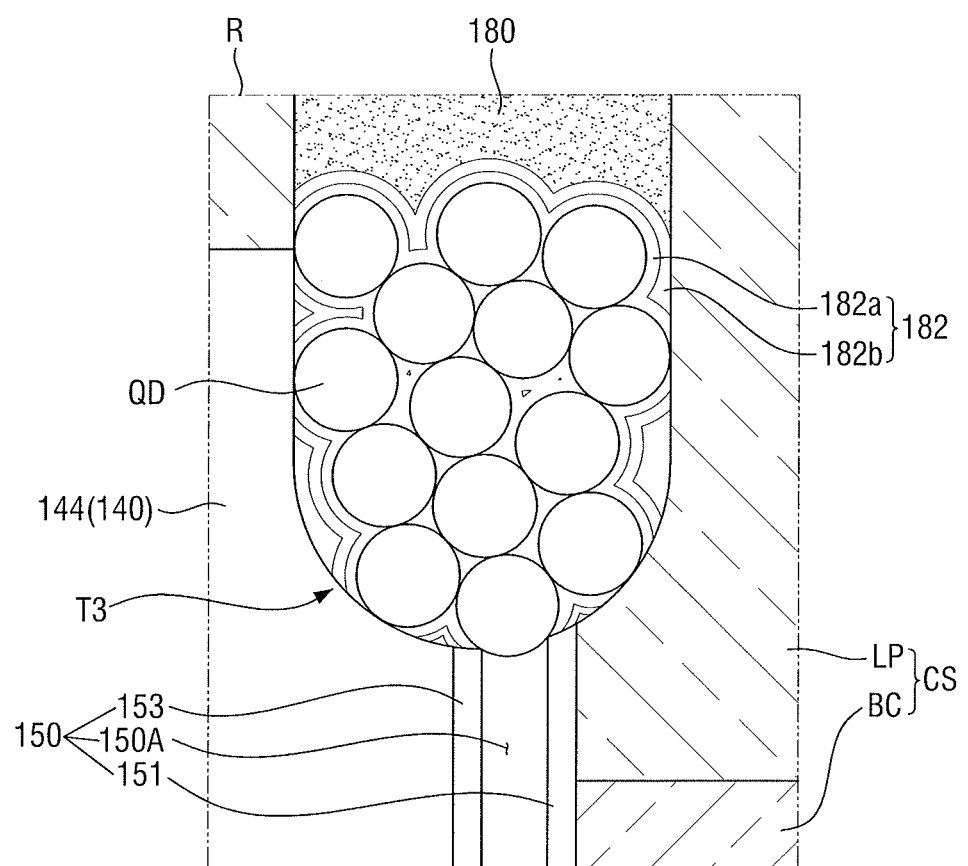

Referring to FIG. 7, in the semiconductor device according to some embodiments, the capping insulation film 182 may be multi-films.

For example, the capping insulation film 182 may include a first capping film 182a and a second capping film 182b sequentially stacked on the quantum dot pattern QD. In an implementation, the first capping film 182a may extend along the outer peripheral surface of the quantum dot pattern QD, and the second capping film 182b may extend between the first capping film 182a and the filling insulation film 180.

In an implementation, the step coverage of the first capping film 182a may be superior to or greater than the step coverage of the second capping film 182b. In an implementation, the first capping film 182a and the second capping film 182b may include silicon carbonitride (SiCN), and a ratio of carbon (C) of the first capping film 182a may be higher than a ratio of carbon (C) of the second capping film 182b.

Figure 8:
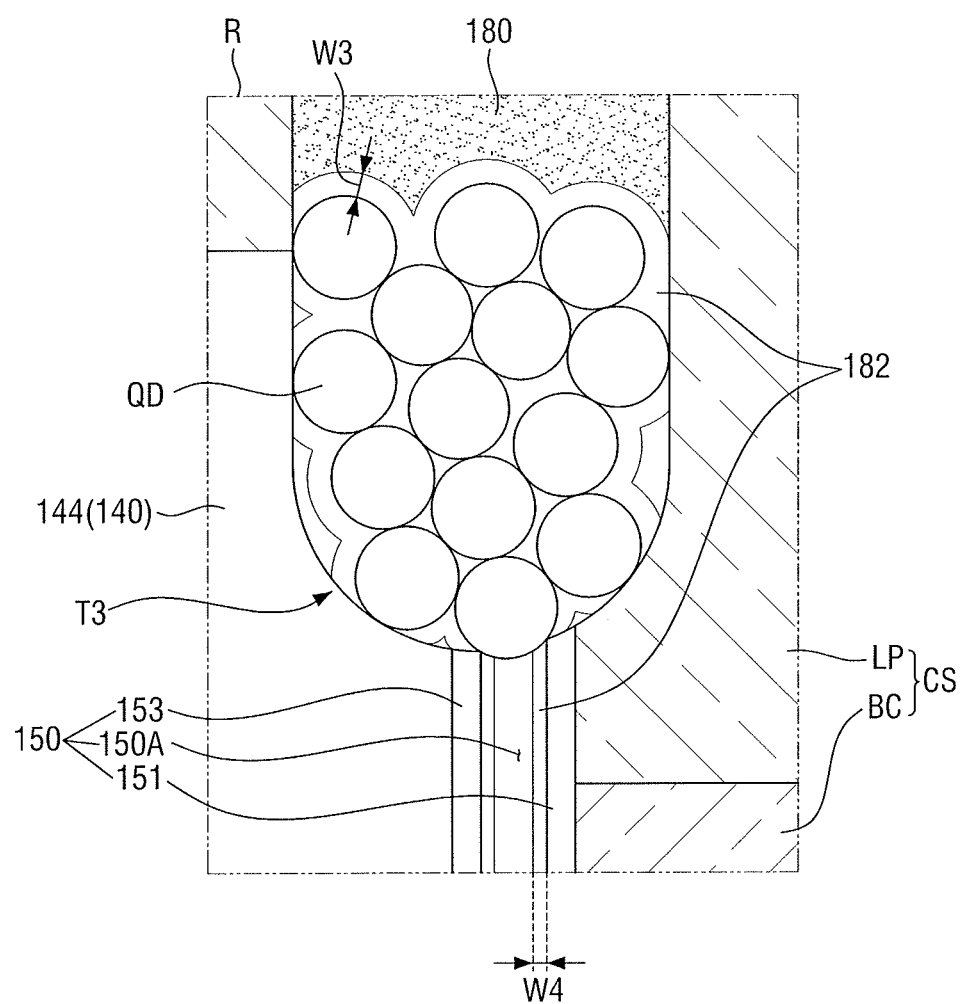

Referring to FIG. 8, in the semiconductor device according to some embodiments, a part of the capping insulation film 182 may be in the air spacer 150A.

For example, a part of the capping insulation film 182 may further extend along the first spacer 151 and/or the third spacer 153.

In an implementation, a thickness W3 of the capping insulation film 182, which extends along the outer peripheral surface of the quantum dot pattern QD, may be greater than a thickness W4 of the capping insulation film 182 in the air spacer 150A. This may be due to the quantum dot pattern QD covering the air spacer 150A. For example, in the process of forming the capping insulation film 182, a part of the capping insulation film 182 entering the air spacer 150A may be blocked by the quantum dot pattern QD.

Referring to FIG. 4 again, the contact structure CS may be on the substrate 110 and the element separation film 120. The contact structure CS may penetrate the insulation pattern 130 to connect the active region AR of the substrate 110 and the capacitor 190.

In an implementation, the contact structure CS may be on the side walls of the bit line structure 140. The contact structure CS may be spaced part from the bit line structure 140 by the spacer structure 150 (e.g., along the first direction X). For example, the spacer structure 150 may electrically insulate the bit line structure 140 and the contact structure CS.

The contact structure CS may include second conductive patterns BC and LP. The second conductive patterns BC and LP may correspond to some of the plurality of conductive patterns 20 of FIG. 1. For example, the second conductive patterns BC and LP may be spaced part from other conductive patterns (e.g., the first conductive patterns 141, 142 and 143) by the air spacer 150A. The second conductive patterns BC and LP may include, e.g., a buried contact BC and a landing pad LP sequentially stacked on the substrate 110.

The buried contact BC may be on the substrate 110 between the plurality of bit line structures 140. For example, as shown in FIG. 3, the buried contact BC may be interposed in in a region defined by the word line structure 160 and the bit line structure 140. In an implementation, the buried contact BC may form a plurality of isolated regions that are spaced part from one another. In an implementation, an upper surface of the buried contact BC may be lower than (e.g., closer to the substrate 110 in the third direction Z than) the upper surface of the bit line structure 140. For example, a distance from the substrate 110 to the upper surface of the buried contact BC in the third direction Z may be less than a distance from the substrate 110 to the upper surface of the bit line structure 140 in the third direction Z.

The buried contact BC may penetrate the insulation pattern 130 to connect the active region AR of the substrate 110 and the landing pad LP. For example, the substrate 110 may include a second trench T2 in the active region AR. The second trench T2 may penetrate the insulation pattern 130 to expose a part of the active region AR. The buried contact BC may be in the second trench T2 to connect the active region AR of the substrate 110 and the landing pad LP.

In an implementation, the second trench T2 may expose both ends of the active region AR. For example, as shown in FIG. 3, the buried contact BC may be connected to both ends of the active region AR. A part of the second trench T2 may overlap a part of the element separation film 120. For example, the second trench T2 may expose not only a part of the substrate 110 but also a part of the element separation film 120.

The buried contact BC may include a conductive material. For example, the buried contact BC may be electrically connected to the active region AR of the substrate 110. The active region AR of the substrate 110 connected to the buried contact BC may function as a source and drain region. In an implementation, the buried contact BC may include, e.g., polysilicon.

The landing pad LP may be on the buried contact BC. For example, the landing pad LP may be connected to the upper surface of the buried contact BC. In an implementation, the upper surface of the landing pad LP may be higher than (e.g., farther from the substrate 110 in the third direction Z than) the upper surface of the bit line structure 140. For example, a distance from the substrate 110 to the upper surface of the landing pad LP in the third direction Z may be greater than the distance from the substrate 110 to the upper surface of the bit line structure 140 in the third direction Z. For example, the landing pad LP may cover a part of the upper surface of the bit line structure 140.

The landing pad LP may form a plurality of isolated regions spaced apart from one another. In an implementation, as illustrated in FIG. 3, each landing pad LP may be, e.g., circular. In an implementation, as illustrated in FIG. 3, the plurality of landing pads LPs may be arranged, e.g., in a honeycomb structure.

The plurality of landing pads LP may be connected to the buried contacts BC forming the plurality of isolated regions, respectively. For example, the respective landing pads LP may be separated by a third trench T3.

The landing pad LP may include a conductive material. For example, the capacitor 190 may be electrically connected to the active region AR of the substrate 110. In an implementation, the landing pad LP may include, e.g., tungsten (W).

In an implementation, a part of the third trench T3 may expose a part of the bit line structure 140. For example, the third trench T3 may extend from the upper surface of the landing pad LP to the lower part of the upper surface of the bit line structure 140. For example, the plurality of landing pads LP may be separated from each other by the bit line structure 140 and the third trench T3. In an implementation, the bottom surface of the third trench T3 may be higher than the bottom surface of the first capping pattern 144. For example, the third trench T3 may expose a part of the first capping pattern 144.

The third trench T3 may correspond to the trench T of FIG. 1. For example, the third trench T3 may expose a part of the upper end of the air spacer 150A. In an implementation, the third trench T3 may expose an upper surface of the first spacer 151 and an upper surface of the third spacer 153.

In an implementation, the quantum dot pattern QD may fill at least a part of the third trench T3. For example, the quantum dot pattern QD may fill a lower part of the third trench T3. For example, the quantum dot pattern QD may cover the upper end of the air spacer 150A exposed by the third trench T3. As shown in FIG. 4, the quantum dot pattern QD may be between the first capping pattern 144 and the landing pad LP. In an implementation, as illustrated in FIGS. 9 and 10, the quantum dot pattern QD may surround the periphery of the landing pad LP.

In an implementation, an uppermost part of the quantum dot pattern QD (e.g., a part of the quantum dot pattern QD distal to the substrate 110) may be higher than (e.g., farther from the substrate 110 in the third direction Z than) the upper surface of the bit line structure 140 (e.g., the surface of the bit line structure 140 that faces away from the substrate 110 in the third direction Z). For example, a distance from the substrate 110 to the uppermost part of the quantum dot pattern QD in the third direction Z may be greater than a distance from the substrate 110 to the upper surface of the bit line structure 140 in the third direction Z. For example, as illustrated in FIGS. 9 and 10, a height H1 from the bottom surface of the third trench T3 to the uppermost part of the quantum dot pattern QD in the third direction Z may be greater than a height H2 from the bottom surface of the third trench T3 to the upper surface of the bit line structure 140 in the third direction Z. For example, as illustrated in FIG. 10, the quantum dot pattern QD may also cover the side surfaces of the upper end of the air spacer 150A.

In an implementation, the filling insulation film 180 may fill another part of the third trench T3. For example, the plurality of landing pads LP may be separated from each other by the bit line structure 140 and the filling insulation film 180. In an implementation, the upper surface of the filling insulation film 180 may be higher than the upper surface of the landing pad LP. In an implementation, the filling insulation film 180 may expose at least a part of the upper surface of the landing pad LP.

The word line structure 160 may extend long along the first direction X across the active region AR and the bit line structure 140. For example, the word line structure 160 may diagonally across the active region AR and vertically cross the bit line structure 140. A plurality of word line structures 160 may extend parallel to one another. In an implementation, the plurality of word line structures 160 may be spaced apart from one another at equal intervals.

The word line structure 160 may include a gate dielectric film 161, third conductive patterns 162 and 163, and a second capping pattern 164.

In an implementation, the third conductive patterns 162 and 163 may be a single film, or may be multi-films including a fourth conductive film 162 and a fifth conductive film 163 as shown. In an implementation, the fourth conductive film 162 and the fifth conductive film 163 may include, e.g., metal, polysilicon or a combination thereof, respectively.

The gate dielectric film 161 may be between the third conductive patterns 162 and 163 and the substrate 110. The gate dielectric film 161 may include, e.g., silicon oxide, silicon oxynitride, silicon nitride, or a high-k material having a dielectric constant greater than that of silicon oxide. Examples of the high-k material may include hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The second capping pattern 164 may be on the third conductive patterns 162 and 163. In an implementation, the second capping pattern 164 may include, e.g., silicon nitride.

In an implementation, as illustrated in FIGS. 9 and 10, the word line structure 160 may be buried in the substrate 110. For example, the substrate 110 may include a fourth trench T4 extending in the first direction X. The gate dielectric film 161 may extend along the profile of the fourth trench T4. The third conductive patterns 162 and 163 may fill a part of the fourth trench T4 on the gate dielectric film 161, and the second capping pattern 164 may fill another part of the fourth trench T4.

The capacitor 190 may be on the filling insulation film 180 and the landing pad LP. The capacitor 190 may be connected to a part of the upper surface of the landing pad LP exposed by the filling insulation film 180. As a result, the capacitor 190 may be electrically connected to the source and drain region connected to the buried contact BC. For example, the capacitor 190 may store the charge in the semiconductor memory device or the like.

For example, the capacitor 190 may include a lower electrode 191, a capacitor dielectric film 192, and an upper electrode 193. The capacitor dielectric film 192 may be between the lower electrode 191 and the upper electrode 193. The capacitor 190 may store electric charge in the capacitor dielectric film 192, using a potential difference generated between the lower electrode 191 and the upper electrode 193.

In an implementation, the lower electrode 191 and the upper electrode 193 may include, e.g., doped polysilicon, a metal, or a metal nitride. In an implementation, the capacitor dielectric film 192 may include, e.g., silicon oxide or high-k materials.

As the high integration of the semiconductor device progresses, the influences of parasitic capacitance and leakage current may gradually increase. For example, as the interval between the bit line structures of DRAM (Dynamic Random Access Memory) becomes narrow, parasitic capacitance between the bit line structure and the bit line structure and between the bit line structure and the contact structure could increase.

In order to minimize the parasitic capacitance, an air spacer may be formed between the bit line structure and the contact structure. In one process of capping the upper part of the air spacer extending along the side walls of the bit line structure, it is possible that the capping insulation film could penetrate into the air spacer, and the width of the air spacer could become narrow. This could cause degradation of the operating characteristics of the semiconductor device including the air spacer.

The semiconductor device according to some embodiments may help minimize penetration of the capping insulation film 182 and/or the filling insulation film 180 into the air spacer 150A, using the quantum dot pattern QD covering the upper end of the air spacer 150A. For example, it is possible to provide a semiconductor device in which the parasitic capacitance between one bit line structure 140 and another bit line structure 140 and between the bit line structure 140 and the contact structure CS is minimized, and the operating characteristics are improved.

Hereinafter, a method for fabricating a semiconductor device according to some embodiments will be described with reference to FIGS. 1 to 24.

Figure 11:
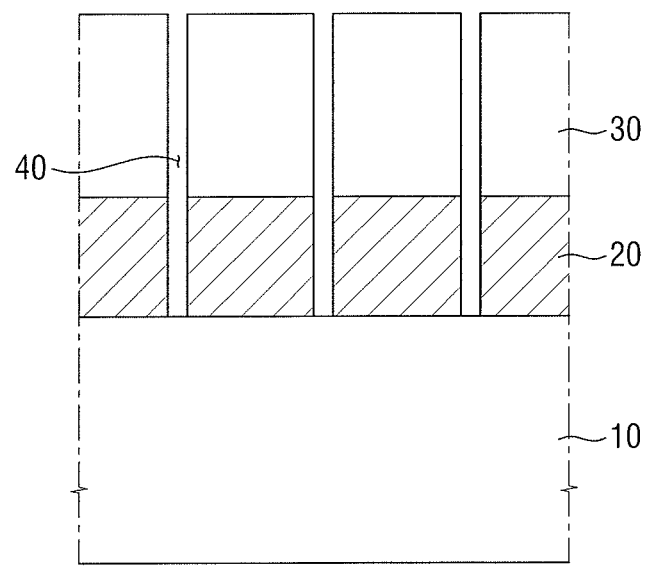
FIGS. 11 to 13 illustrate stages in a method for fabricating the semiconductor device according to some embodiments.
Figure 12:
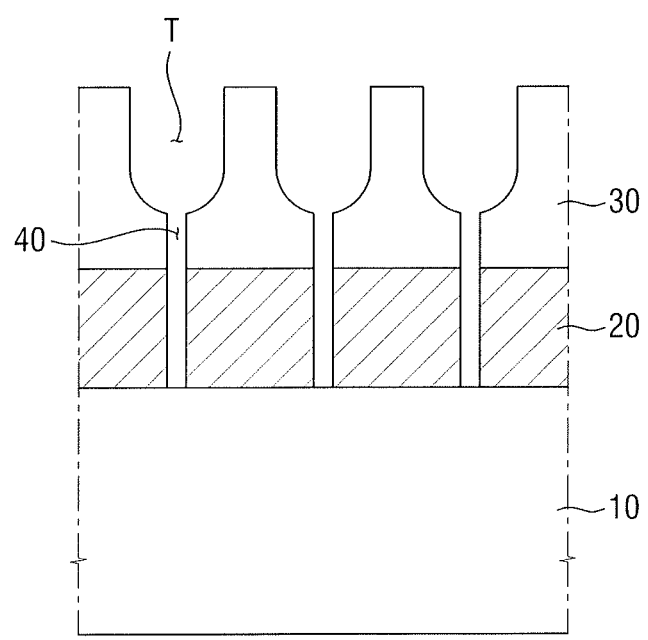
Figure 13:
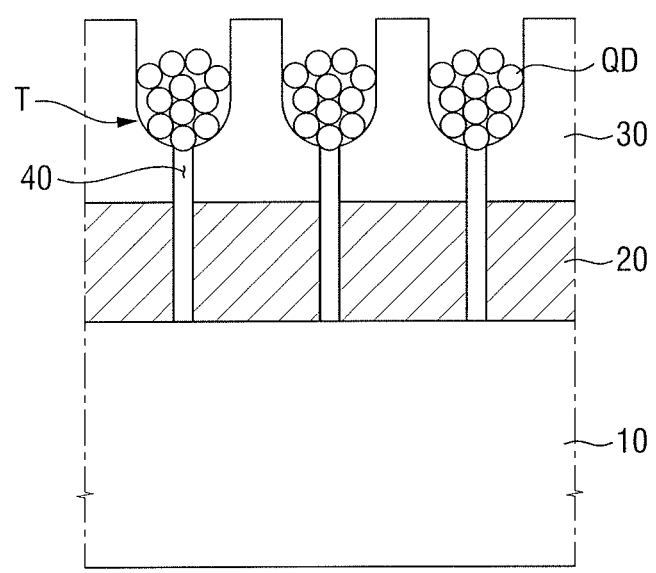

FIGS. 11 to 13 illustrate stages in a method for fabricating the semiconductor device according to some embodiments. For the convenience of description, repeated parts of those described above using FIGS. 1 to 10 may be briefly described or omitted.

Referring to FIG. 11, a plurality of conductive patterns 20 and a plurality of capping patterns 30 may be formed on the substrate 10.

For example, the conductive film and the insulation film may be sequentially formed on the substrate 10. Subsequently, the conductive film and the insulation film may be patterned to form a plurality of conductive patterns 20 spaced apart from one another and a plurality of capping patterns 30 spaced apart from one another.

Also, an air spacer 40 may be formed to separate the plurality of conductive patterns 20 from each other. For example, the air spacer 40 may be between two adjacent conductive patterns 20.

Referring to FIG. 12, a trench T may be formed in the capping pattern 30.

The trench T may be formed to expose the upper part or upper end of the air spacer 40. For example, a part of the capping pattern 30 adjacent to the air spacer 40 may be etched to form the trench T.

Referring to FIG. 13, the quantum dot pattern QD (which fills at least a part of the trench T) may be formed.

The quantum dot pattern QD may cover the upper end of the air spacer 4. In an implementation, the size of the quantum dot pattern QD may be greater than the width of the air spacer 40. For example, the quantum dot pattern QD may cover the upper end of the air spacer 40, without filling the air spacer 40.

The quantum dot pattern QD may include a plurality of quantum dots. In an implementation, the quantum dot pattern QD may include, e.g., silicon oxide quantum dots, silicon nitride quantum dots, polysilicon quantum dots, silicon germanium quantum dots, or combinations thereof.

In an implementation, the quantum dot pattern QD may be formed, e.g., by a coating method. For example, quantum dots may be dispersed in a polymer, and the quantum dots dispersed in polymer may be subjected to spin coating, screen printing, or the like. For example, a plurality of quantum dots which fills the trench T may be formed. In an implementation, the quantum dots may be formed by, e.g., coating quantum dot colloids by self-assembly using dip coating or a Langmuir-Blodgett method or the like, or by forming quantum dot nuclei using a chemical vapor deposition (CVD) or a physical vapor deposition (PVD).

Subsequently, an etchback process may be performed on the quantum dots. For example, the quantum dot pattern QD which fills at least a part of the trench T may be formed.

FIGS. 14 to 24 illustrate stages in a method for fabricating the semiconductor device according to some embodiments. For the convenience of description, repeated parts of those described above using FIGS. 1 to 13 may be briefly described or omitted. FIGS. 14 to 24 illustrate cross-sectional views taken along the line A-A' of FIG. 3.

Figure 14:
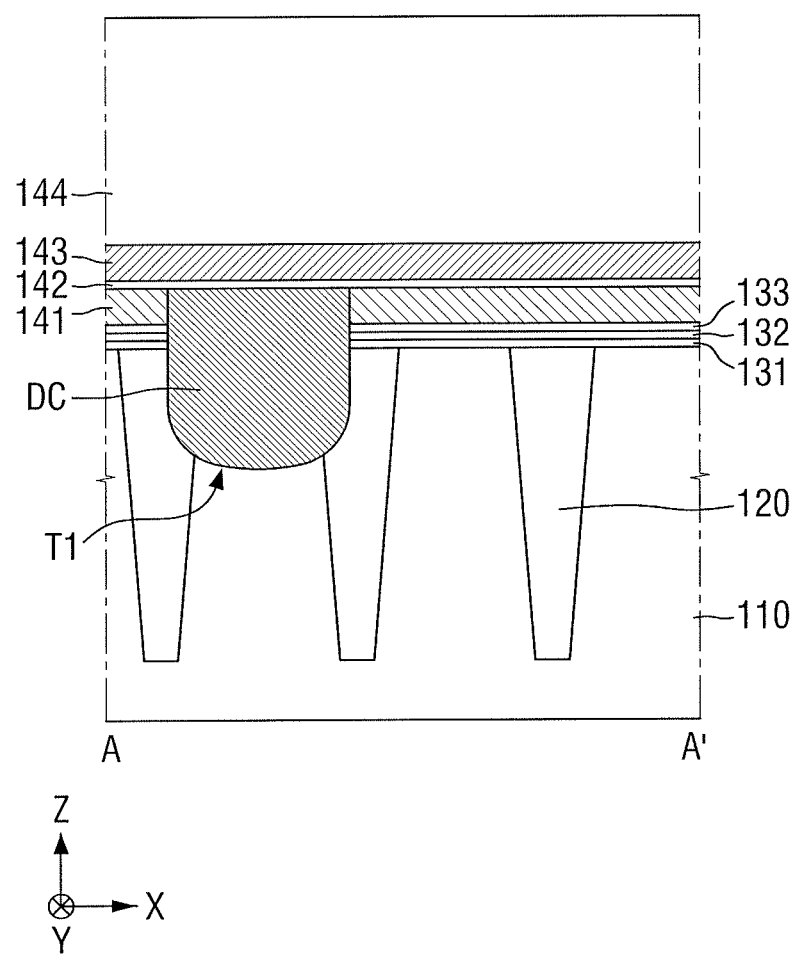
FIGS. 14 to 24 illustrate stages in a method for fabricating the semiconductor device according to some embodiments.

Referring to FIG. 14, first to third insulation films 131, 132 and 133, first to third conductive films 141, 142 and 143, the direct contact DC and the first capping pattern 144 may be formed on the substrate 110 and the element separation film 120.

For example, the first to third insulation films 131, 132 and 133 and the first conductive film 141 may be sequentially formed on the substrate 110 and the element separation film 120. Subsequently, a first trench T1 (which exposes a part of the active region AR) may be formed in the substrate 110. In an implementation, the first trench T1 may expose the center of the active region AR. Subsequently, the direct contact DC filling the first trench T1 may be formed. Subsequently, second and third conductive films 142 and 143 and the first capping pattern 144 may be formed on the first conductive film 141 and the direct contact DC.

Figure 15:
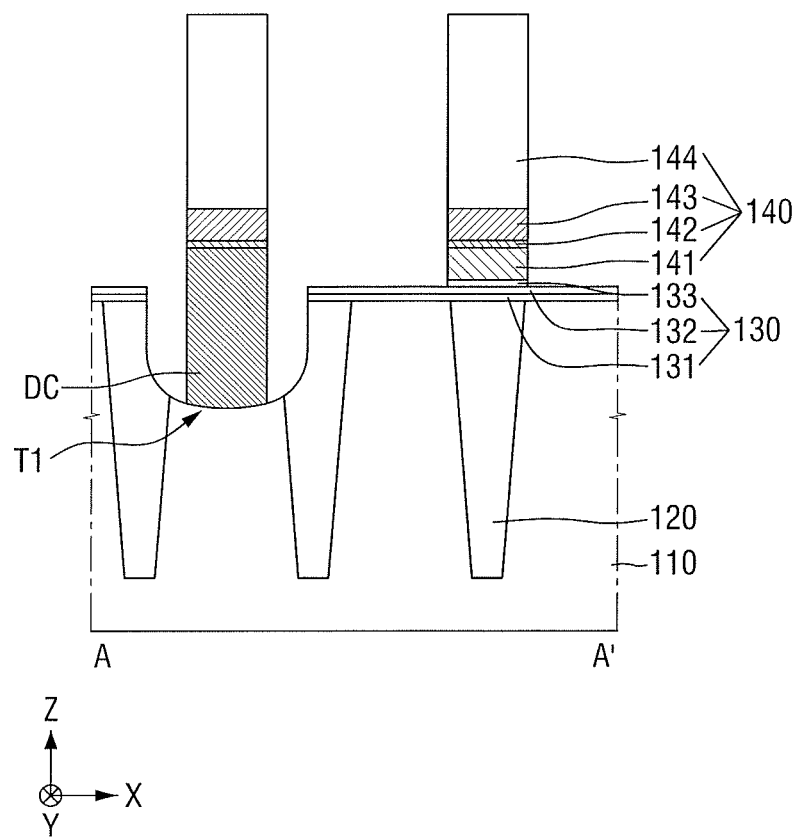

Referring to FIG. 15, the first to third conductive films 141, 142, and 143, the direct contact DC, and the first capping pattern 144 may be patterned.

For example, the bit line structure 140 extending lengthwise along the second direction Y across the active region AR and the word line structure 160 may be formed. In an implementation, the width of the bit line structure 140 and the width of the direct contact DC may be smaller than the width of the first trench T1 (e.g., along the first direction X). For example, the patterned direct contact DC may not completely fill the first trench T1.

In an implementation, the third insulation film 133 may also be patterned. The third insulation film 133 may be patterned to have the same width as the width of the bit line structure 140 (along the first direction X).

Figure 16:
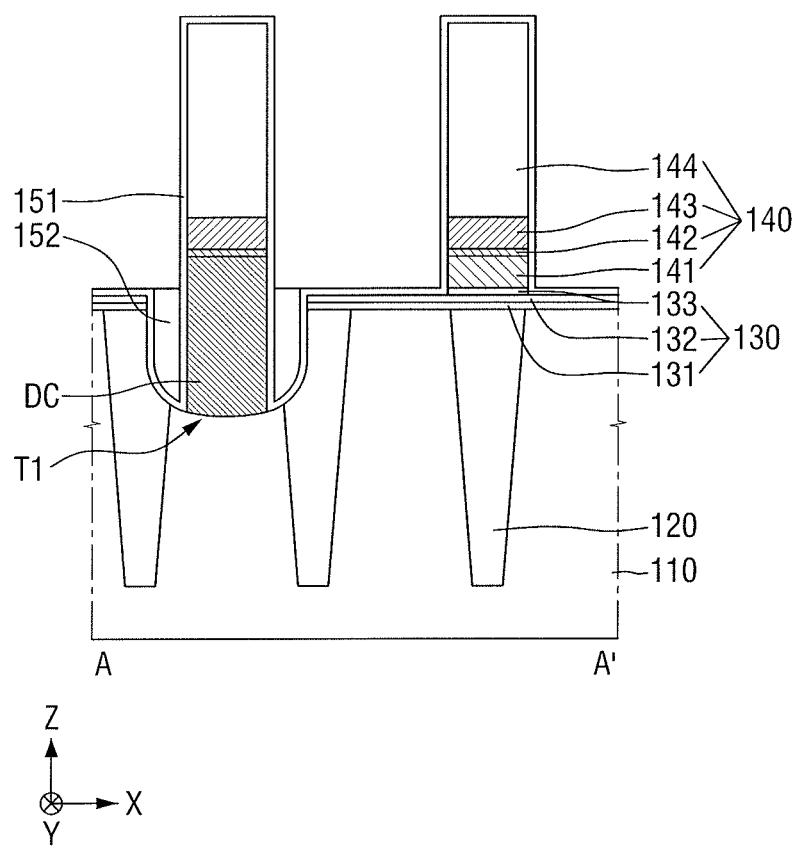

Referring to FIG. 16, a first spacer 151 and a second spacer 152 may be formed on the product of FIG. 15.

In an implementation, the first spacer 151 may be formed conformally. As a result, the first spacer 151 may extend along the side walls and the upper surface of the bit line structure 140, the side walls of the direct contact DC, the upper surface of the second insulation film 132 and the profile of the first trench T1.

The second spacer 152 may be formed on the first spacer 151. In an implementation, the second spacer 152 may fill a region of first trench T1 that remains unfilled after filling of the direct contact DC and the first spacer 151. For example, a first spacer film may be formed on the first spacer 151. Subsequently, a part of the first spacer film may be etched, using the first spacer 151 as an etching stop film. For example, the second spacer 152 which fills the first trench T1 may be formed.

Figure 17:
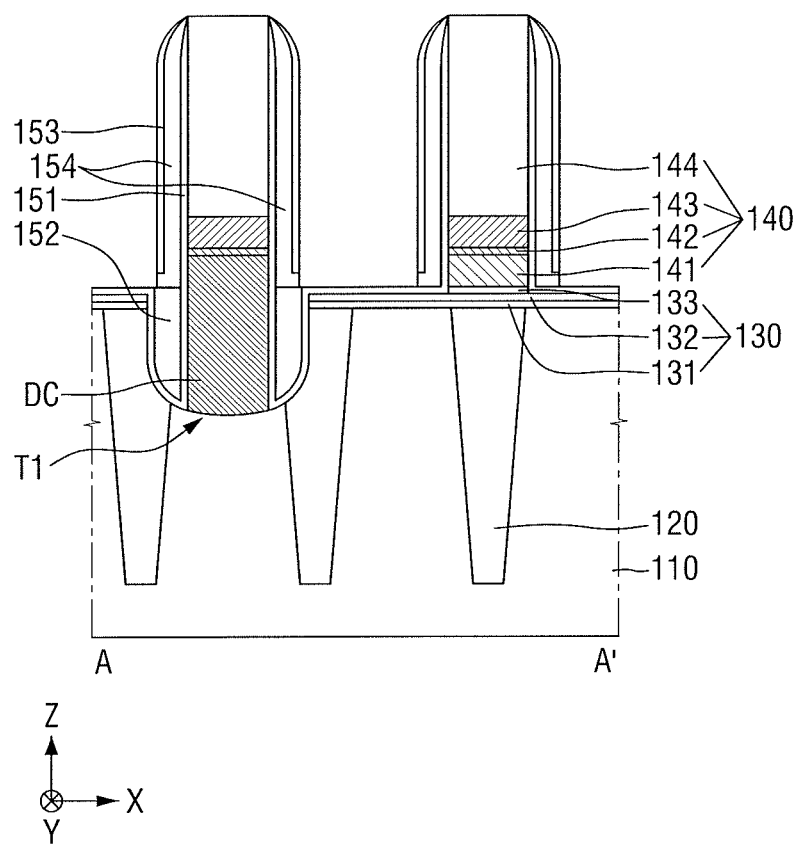

Referring to FIG. 17, a sacrificial spacer 154 and a third spacer 153 may be formed on the side walls of the bit line structure 140 (e.g., to form a preliminary spacer structure).

The sacrificial spacer 154 and the third spacer 153 may extend along the side walls of the bit line structure 140. For example, a second spacer film and a third spacer film sequentially stacked on the first spacer 151 and the second spacer 152 may be formed. Subsequently, a part of the second spacer film and a part of the third spacer film may be etched, using the first spacer 151 and the second spacer 152 as the etching stop film. For example, the sacrificial spacer 154 and the third spacer 153 may be formed on the first spacer 151 and the second spacer 152.

In an implementation, the sacrificial spacer 154 may include materials having etching selectivity with respect to those of the first to third spacers 151, 152 and 153. For example, the first to third spacers 151, 152 and 153 may include silicon nitride, and the sacrificial spacer 154 may include silicon oxide.

Figure 18:
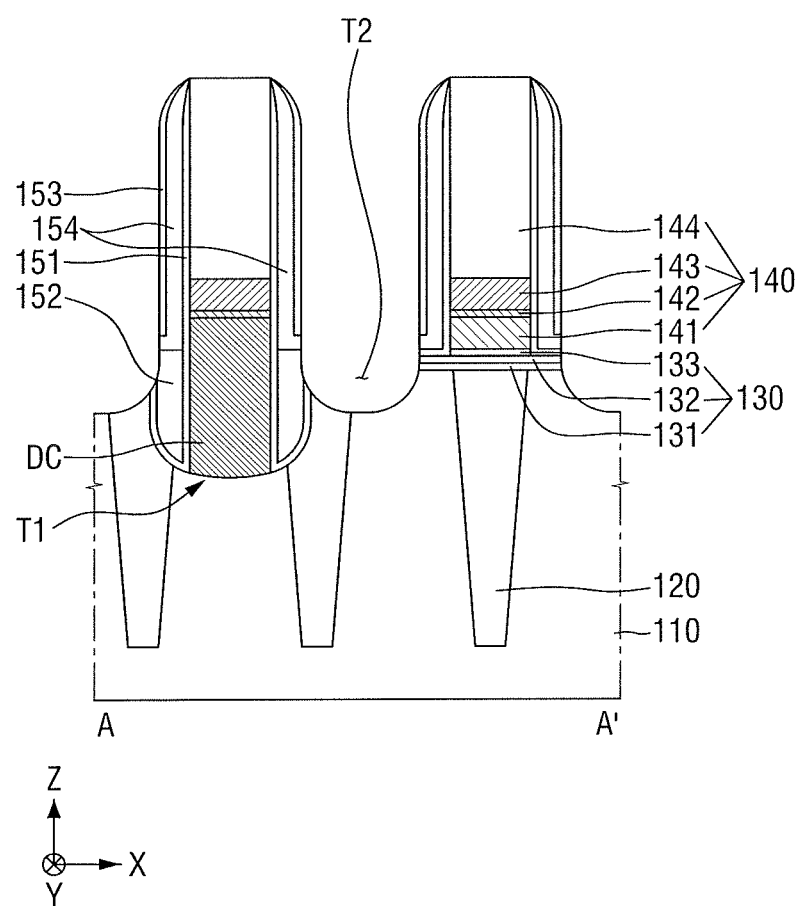

Referring to FIG. 18, a second trench T2 is formed in the substrate 110.

The second trench T2 may penetrate the insulation pattern 130 to expose a part of the active region AR. For example, the insulation pattern 130 between the bit line structure 140 may be etched to form the second trench T2. In an implementation, the second trench T2 may expose both ends of the active region AR.

Figure 19:
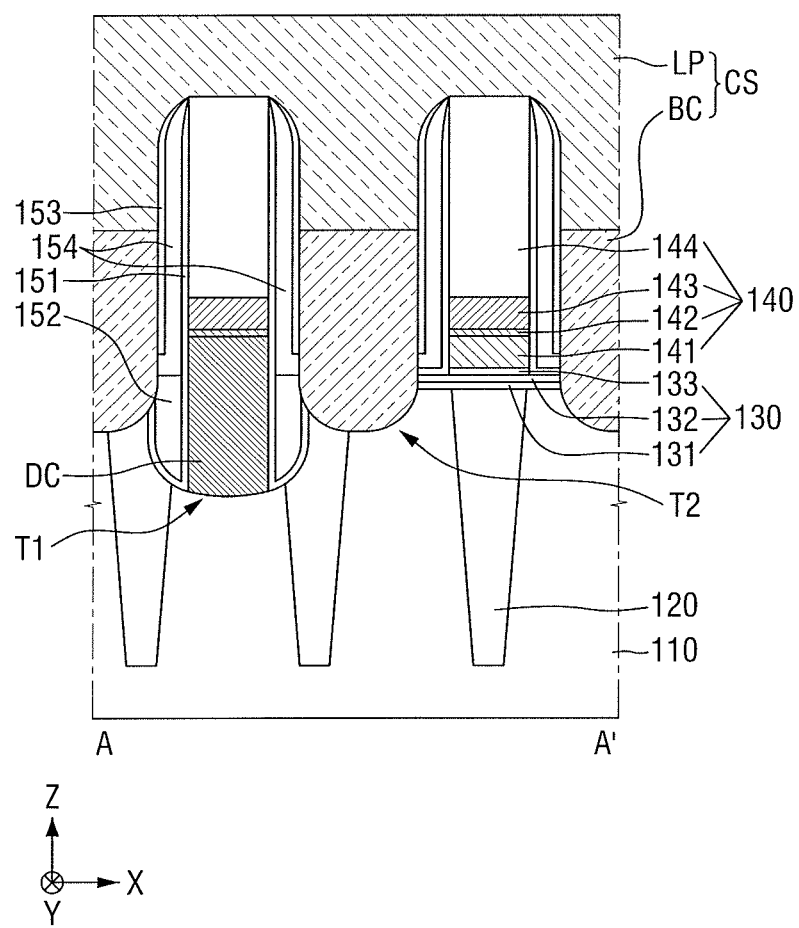

Referring to FIG. 19, a contact structure CS may be formed in the second trench T2.

For example, a polysilicon film may be formed on the product of FIG. 18. Next, an etchback process may be performed such that the upper surface of the polysilicon film becomes lower than (e.g., closer to the substrate 110 in the third direction Z) the upper surface of the preliminary spacer structure (e.g., the first spacer 151, the second spacer 152, the third spacer 153, and the sacrificial spacer 154). For example, a buried contact BC that forms a plurality of isolated regions may be formed.

Next, a landing pad LP may be formed on the buried contact BC. In an implementation, an upper surface of the landing pad LP may be higher than (e.g., farther from the substrate 100 in the third direction Z than) an upper surface of the spacer structure. In an implementation, the landing pad LP may include, e.g., tungsten (W).

Figure 20:
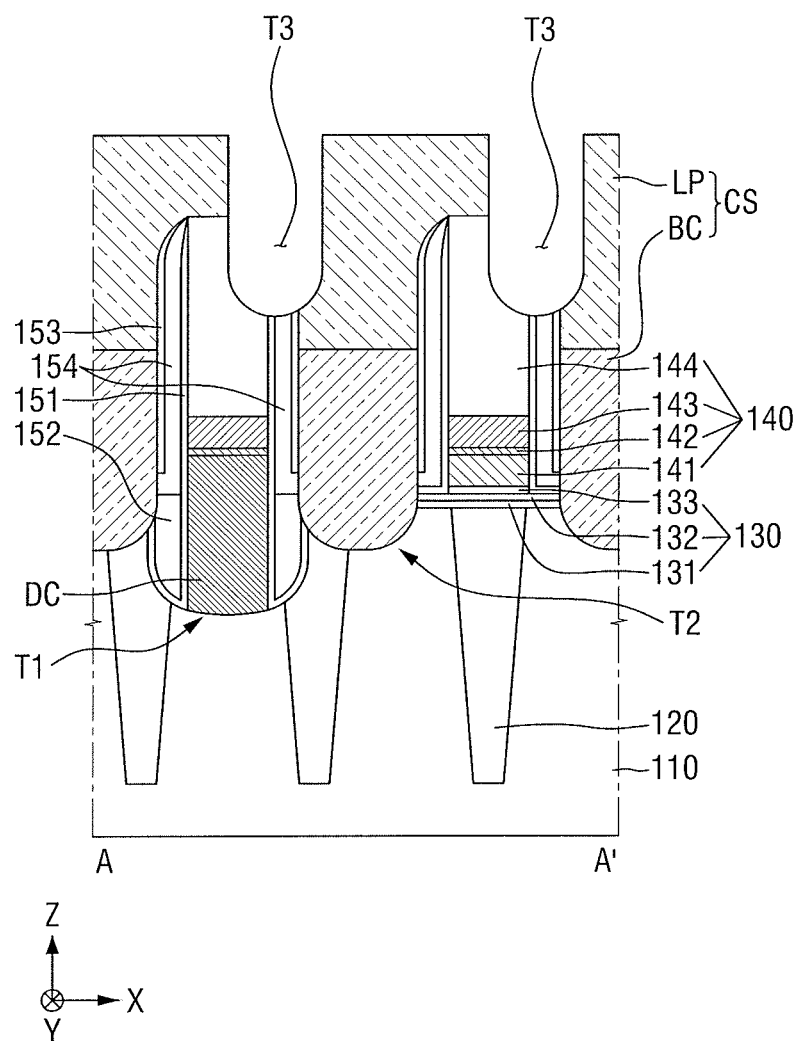

Referring to FIG. 20, a third trench T3 may be formed in the landing pad LP.

For example, the landing pad LP may be patterned by the third trench T3. The landing pad LP that forms a plurality of isolated regions may be formed. In an implementation, the third trench T3 may be formed such that plurality of landing pads LP may be arranged in a honeycomb structure.

In an implementation, the third trench T3 may be formed to overlap a part of the bit line structure 140 and the preliminary spacer structure. For example, the upper part of the sacrificial spacer 154 may be exposed by the third trench T3.

Figure 21:
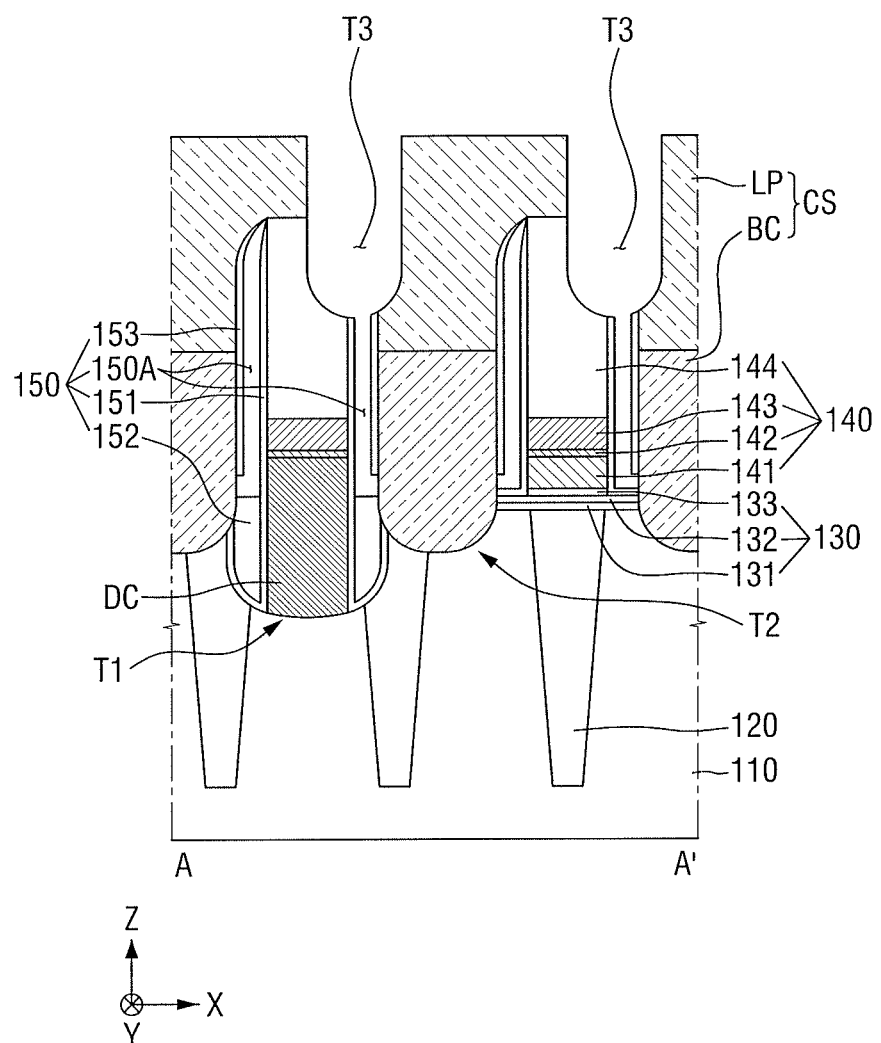

Referring to FIG. 21, the sacrificial spacer 154 may be removed to form an air spacer 150A.

For example, after the third trench T3 is formed, a wet etching process may be performed. In an implementation, the wet etching process may use, e.g., hydrogen fluoride (HF) or phosphoric acid ($H_3PO_4$). For example, the sacrificial spacer 154 exposed by the third trench T3 may be removed, and the air spacer 150A defined by the first to third spacers 151, 152 and 153 may be formed.

Figure 22:
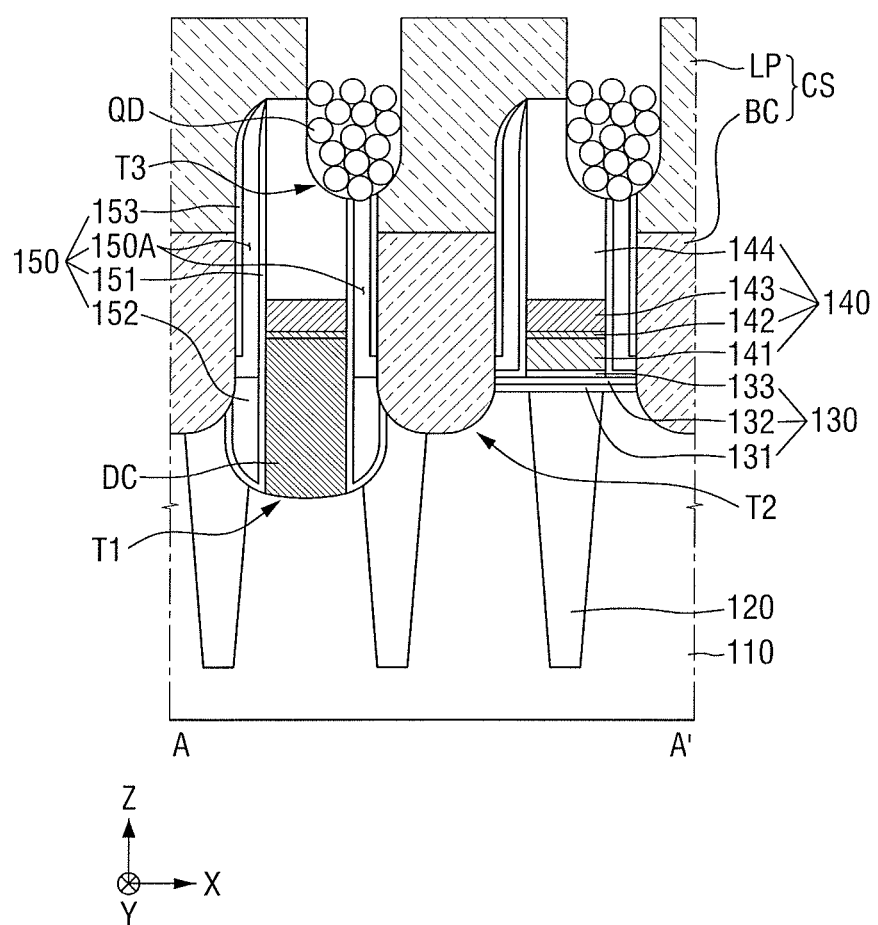

Referring to FIG. 22, the quantum dot pattern QD may fill at least a part of the third trench T3.

The quantum dot pattern QD may cover the upper end of the air spacer 150A. In an implementation, the size of the quantum dot pattern QD may be greater than the width of the air spacer 150A. For example, the quantum dot pattern QD may cover the upper part of the air spacer 150A, e.g., may block an opening at the upper end of the air spacer 150A, without filling the air spacer 150A.

The formation of the quantum dot pattern may be similar to that described above using FIG. 13, a repeated detailed description thereof will not be provided.

Figure 23:
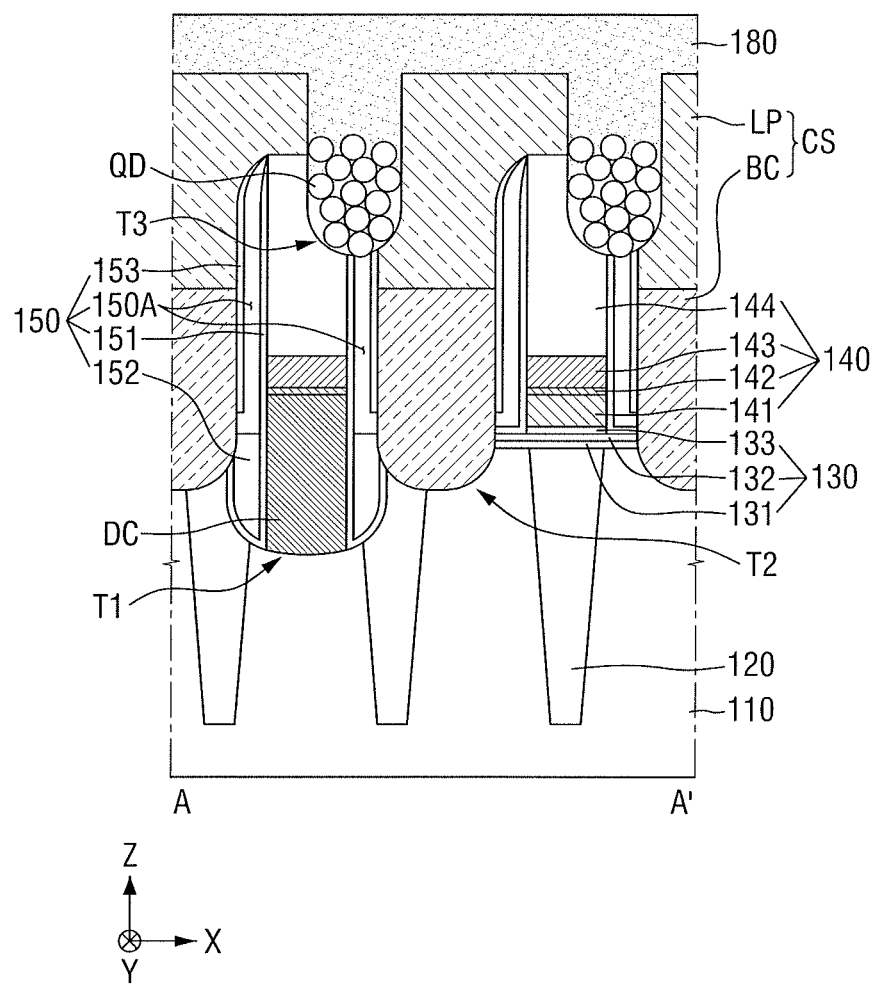

Referring to FIG. 23, a filling insulation film 180 may be formed on the quantum dot pattern QD.

The filling insulation film 180 may cover the quantum dot pattern QD. In an implementation, the filling insulation film 180 may include, e.g., silicon nitride (SiN), silicon oxynitride (SiON), silicon oxide ($SiO_2$), silicon oxycarbide (SiOC), silicon carbonitride (SiCN), silicon oxycarbonitride (SiOCN), or combinations thereof.

In an implementation, the filling insulation film 180 may be formed by, e.g., a low pressure chemical vapor deposition (LPCVD).

Figure 24:
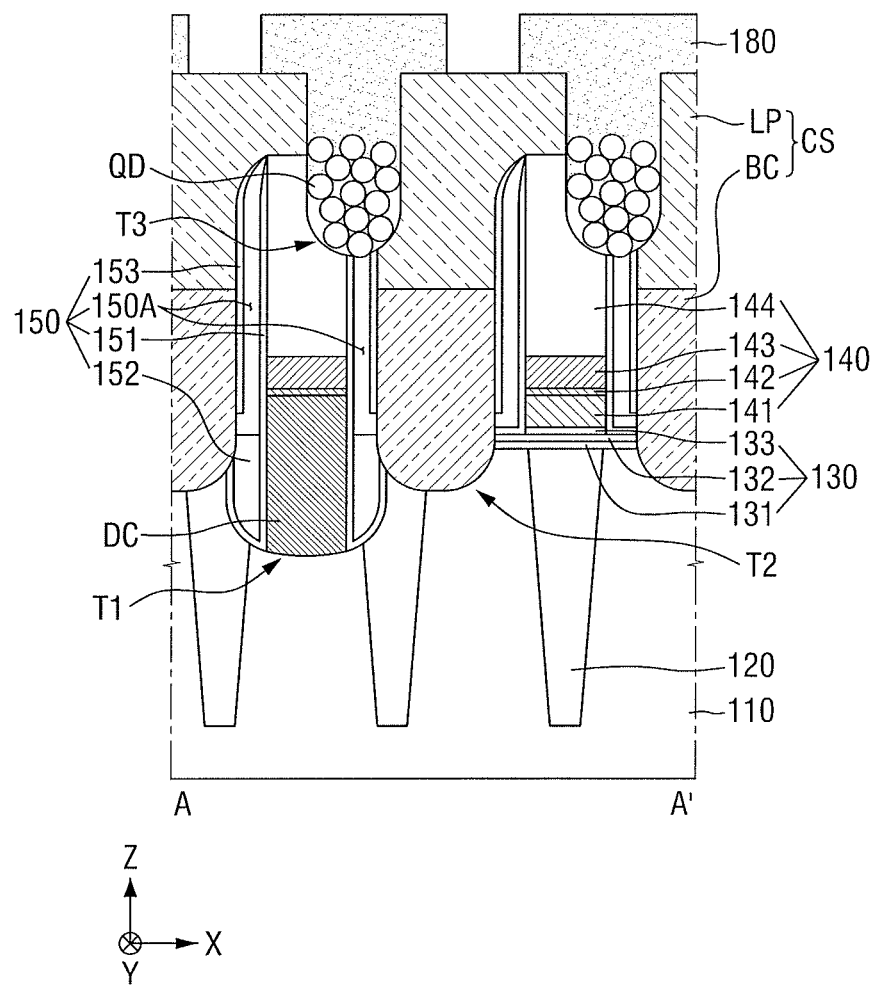

Referring to FIG. 24, the filling insulation film 180 may be patterned to expose a part of the upper surface of the landing pad LP.

Subsequently, referring to FIG. 4, a capacitor 190 may be formed on the filling insulation film 180 and the landing pad LP. For example, the capacitor 190 may be connected to a part of the upper surface of the landing pad LP exposed by the filling insulation film 180.

By way of summation and review, as the high integration of the semiconductor device progresses, influences of parasitic capacitance and leakage current could gradually increase. The parasitic capacitance and the leakage current could degrade the operating characteristics of the semiconductor device.

One or more embodiments may provide a semiconductor device including an air spacer.

One or more embodiments may provide a semiconductor device capable of minimizing parasitic capacitance and leakage current.

One or more embodiments may provide a semiconductor device having improved operating characteristics.

One or more embodiments may provide a method for fabricating a semiconductor device having improved operating characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   sequentially forming a conductive film and a capping film on a substrate,
   forming a first conductive pattern, a second conductive pattern spaced apart from the first conductive pattern, a first capping pattern, a second capping pattern spaced apart from the first capping pattern and an air spacer disposed between the first conductive pattern and the second conductive pattern, and
   forming a quantum dot pattern covering an upper portion of the air spacer.

2. The method for fabricating the semiconductor device of claim 1, further comprising:
   forming a trench exposing the upper portion of the air spacer, in the first capping pattern and the second capping pattern, and
   wherein the quantum dot pattern fills at least a portion of the trench.

3. The method for fabricating the semiconductor device of claim 1, wherein:
   the quantum dot pattern includes a plurality of quantum dots, and
   a size of each quantum dot is larger than a width of the air spacer.

4. The method for fabricating the semiconductor device of claim 1, further comprising forming a filling insulating film covering the quantum dot pattern.

5. The method for fabricating the semiconductor device of claim 4, wherein forming the filling insulation film includes:
   forming a capping insulating film along an outer circumferential surface of the quantum dot pattern,
   forming the filling insulation film covering the quantum dot pattern and the capping insulating film, and
   wherein a step coverage of the capping insulating film is superior to that of the filling insulating film.

6. The method for fabricating the semiconductor device of claim 5, wherein:
   the capping insulating film includes silicon carbonitride, and
   the filling insulating film includes silicon nitride.

7. The method for fabricating the semiconductor device of claim 5, wherein:
   forming the capping insulating film includes:
   forming a first capping film extending along the outer circumferential surface of the quantum dot pattern, and
   forming a second capping film extending along an outer circumferential surface of the first capping film, and
   a step coverage of the first capping film is superior to that of the second capping film.

8. The method for fabricating the semiconductor device of claim 1, wherein the quantum dot pattern includes at least one of silicon oxide quantum dots, silicon nitride quantum dots, polysilicon quantum dots, silicon germanium quantum dots, and combinations thereof.

9. A method for fabricating a semiconductor device, the method comprising:
   forming a substrate including an active region,
   forming a first conductive pattern on the substrate,
   forming a sacrificial spacer along a sidewall of the first conductive pattern,
   forming a capping pattern covering the sacrificial spacer and the first conductive pattern,
   forming a first trench exposing an upper portion of the sacrificial spacer, in the capping pattern,
   forming an air spacer by removing the sacrificial spacer through the first trench, and
   forming a quantum dot pattern filling at least a portion of the first trench.

10. The method for fabricating the semiconductor device of claim 9, wherein forming the first conductive pattern includes:
    forming a second trench exposing a portion of the active region, in the substrate, and
    forming the first conductive pattern to fill a portion of the second trench.

11. The method for fabricating the semiconductor device of claim 10, wherein forming the first conductive pattern to fill a portion of the second trench includes:
    forming the first conductive pattern to fill the second trench, and
    removing a portion of the first conductive pattern contacting a sidewall of the second trench by patterning the first conductive pattern.

12. The method for fabricating the semiconductor device of claim 9, further comprising, after forming the sacrificial spacer, forming a second conductive pattern spaced apart from the first conductive pattern by the sacrificial spacer, on the substrate.

13. The method for fabricating the semiconductor device of claim 12, wherein:
    forming the first conductive pattern includes:
    forming a second trench exposing a portion of the active region, in the substrate, and
    forming the first conductive pattern to fill a portion of the second trench, and
    forming the second conductive pattern includes:

forming a third trench exposing another portion of the active region, in the substrate, and forming the second conductive pattern to fill the third trench.

14. The method for fabricating the semiconductor device of claim 9, wherein forming the sacrificial spacer includes sequentially forming a first spacer, the sacrificial spacer, and a second spacer on a side surface of the first conductive pattern.

15. The method for fabricating the semiconductor device of claim 14, wherein the first spacer and the second spacer includes silicon nitride.

16. The method for fabricating the semiconductor device of claim 9, wherein the capping pattern includes silicon nitride.

17. The method for fabricating the semiconductor device of claim 9, further comprising after forming the quantum dot pattern, forming a filling insulating film filling another portion of the first trench, on the quantum dot pattern.

18. The method for fabricating the semiconductor device of claim 9, wherein the quantum dot pattern includes at least one of silicon oxide quantum dots, silicon nitride quantum dots, polysilicon quantum dots, silicon germanium quantum dots, and combinations thereof.

19. A method for fabricating a semiconductor device, the method comprising:

forming a substrate including an active region, forming a bit line structure crossing the active region on the substrate, forming an air spacer extending along a sidewall of the bit line structure, and forming a quantum dot pattern covering an upper portion of the air spacer.

20. The method for fabricating the semiconductor device of claim 19, further comprising, before forming the air spacer, forming a contact structure connected to the active region and disposed on both sides of the bit line structure.

* * * * *